United States Patent
Lee et al.

(10) Patent No.: US 7,643,334 B1
(45) Date of Patent: Jan. 5, 2010

(54) HIGH-SPEED CONTROLLER FOR PHASE-CHANGE MEMORY PERIPHERAL DEVICE

(75) Inventors: Charles C. Lee, Cupertino, CA (US); Abraham C. Ma, Fremont, CA (US); Edward W. Lee, Mountain View, CA (US)

(73) Assignee: Super Talent Electronics, Inc., San Jose, CA (US)

( * ) Notice: Subject to any disclaimer, the term of this patent is extended or adjusted under 35 U.S.C. 154(b) by 344 days.

(21) Appl. No.: 11/836,264

(22) Filed: Aug. 9, 2007

Related U.S. Application Data

(63) Continuation-in-part of application No. 11/769,324, filed on Jun. 27, 2007, and a continuation-in-part of application No. 11/748,595, filed on May 15, 2007, now Pat. No. 7,471,556, and a continuation-in-part of application No. 11/740,398, filed on Apr. 26, 2007.

(51) Int. Cl.
    *G11C 11/00* (2006.01)
(52) U.S. Cl. ...................................................... 365/163
(58) Field of Classification Search ................ 365/163, 365/189.05, 230.03, 230.06, 219–221
    See application file for complete search history.

(56) References Cited

U.S. PATENT DOCUMENTS

| | | | |
|---|---|---|---|
| 5,933,365 A | 8/1999 | Klersy et al. | |
| 6,512,241 B1 | 1/2003 | Lai | |
| 6,869,883 B2 | 3/2005 | Chiang et al. | |
| 7,026,639 B2 | 4/2006 | Cho et al. | |
| 7,078,273 B2 | 7/2006 | Matsuoka et al. | |
| 7,103,718 B2 | 9/2006 | Nickel et al. | |
| 7,471,556 B2* | 12/2008 | Chow et al. | 365/163 |
| 2003/0223285 A1 | 12/2003 | Khouri et al. | |
| 2004/0228163 A1 | 11/2004 | Khouri et al. | |
| 2004/0248339 A1 | 12/2004 | Lung | |
| 2004/0256610 A1 | 12/2004 | Lung | |
| 2005/0185572 A1 | 8/2005 | Resta et al. | |
| 2006/0018183 A1 | 1/2006 | De Sandre et al. | |
| 2006/0097239 A1 | 5/2006 | Hsiung | |
| 2006/0126381 A1 | 6/2006 | Khouri et al. | |
| 2006/0203542 A1 | 9/2006 | Kurotsuchi et al. | |
| 2006/0274574 A1 | 12/2006 | Choi et al. | |
| 2007/0255891 A1* | 11/2007 | Chow et al. | 711/103 |
| 2008/0266991 A1* | 10/2008 | Lee et al. | 365/203 |
| 2008/0270811 A1* | 10/2008 | Chow et al. | 713/323 |

* cited by examiner

*Primary Examiner*—Gene N. Auduong
(74) *Attorney, Agent, or Firm*—Stuart T. Auvinen; gPatent LLC

(57) ABSTRACT

Phase-change memory (PCM) cells store data using alloy resistors in high-resistance amorphous and low-resistance crystalline states. The time of the memory cell's set-current pulse can be 100 ns, much longer than read or reset times. The write time depends on the write data state and is relatively long for set, but short for clear. A PCM chip has a lookup table (LUT) caching write data that is later written to a PCM bank. Host data is latched into a line FIFO and written into the LUT, reducing write delays to the slower PCM. The PCM chip has upstream and downstream serial interfaces to other PCM chips arranged as a token stub. Requests are passed down the token-stub while acknowledgements are passed up the token-stub to the host's memory controller. Shared chip-enable lines are driven by the upstream PCM chip for requests, and by the downstream PCM chip for acknowledgements.

20 Claims, 17 Drawing Sheets

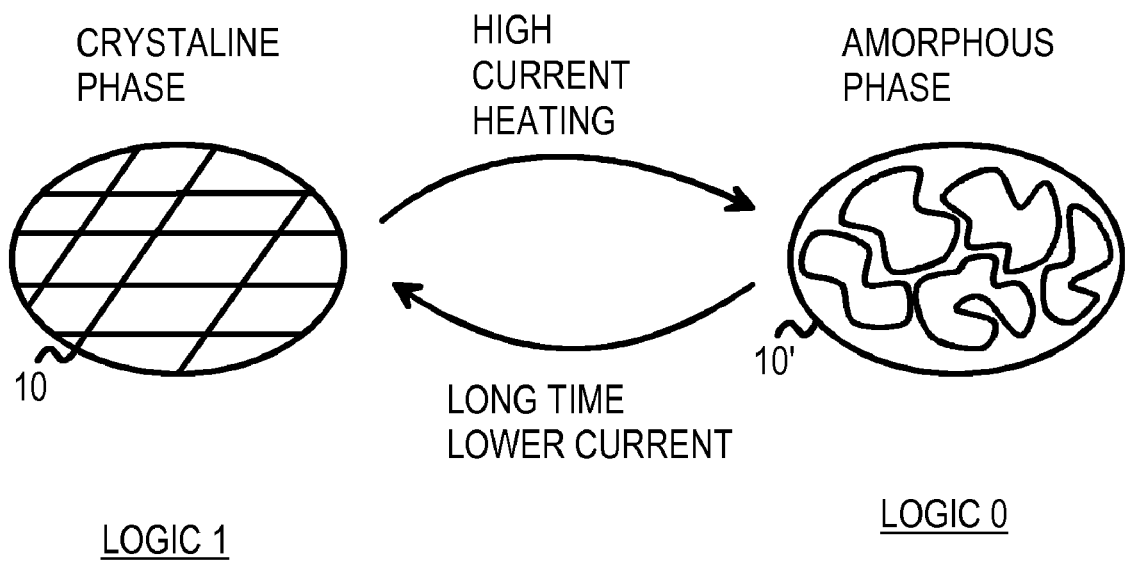
FIG. 1

100

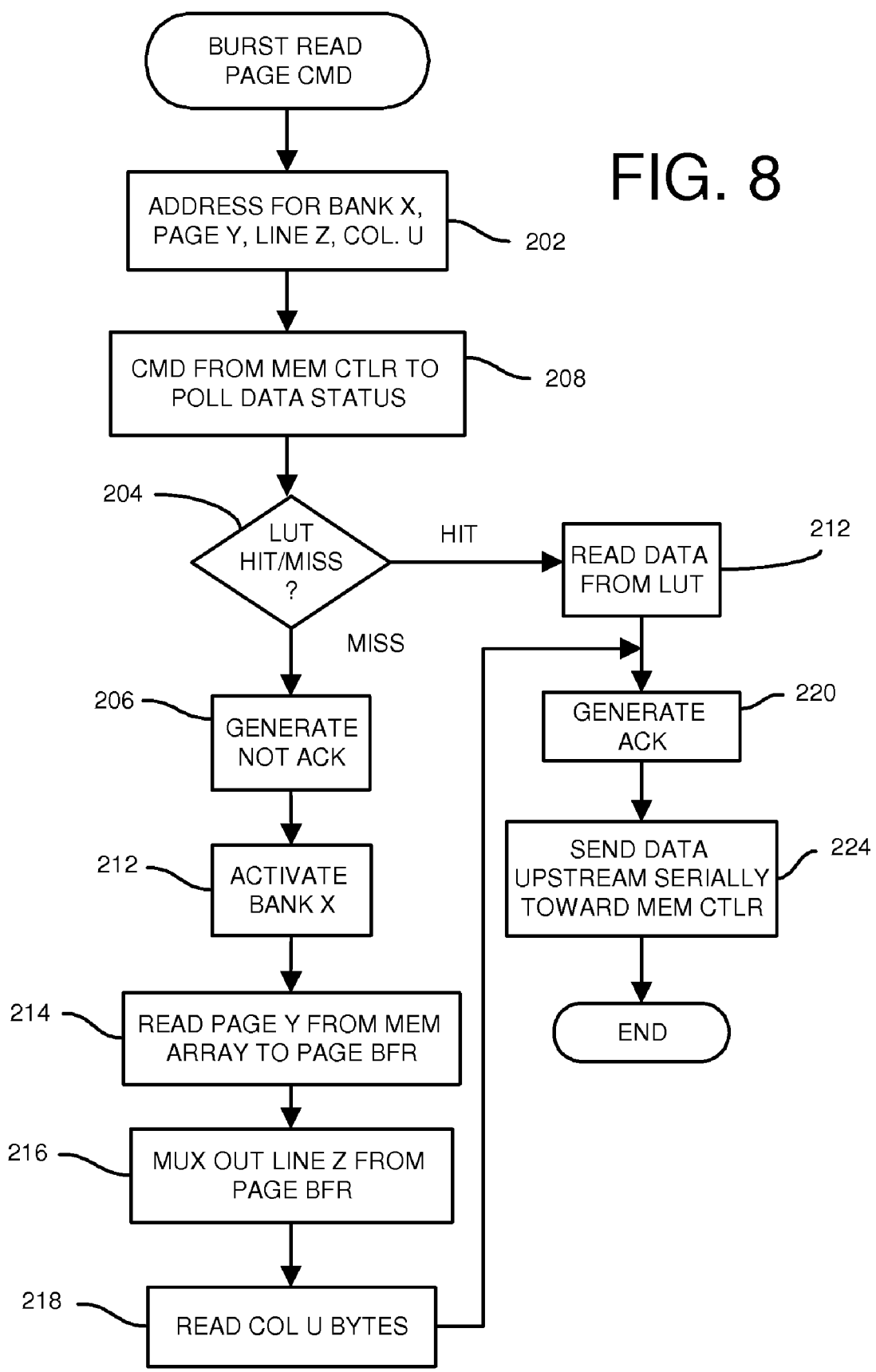

WR SINGLE-BANK MISS

WR SINGLE-BANK HIT, MISS

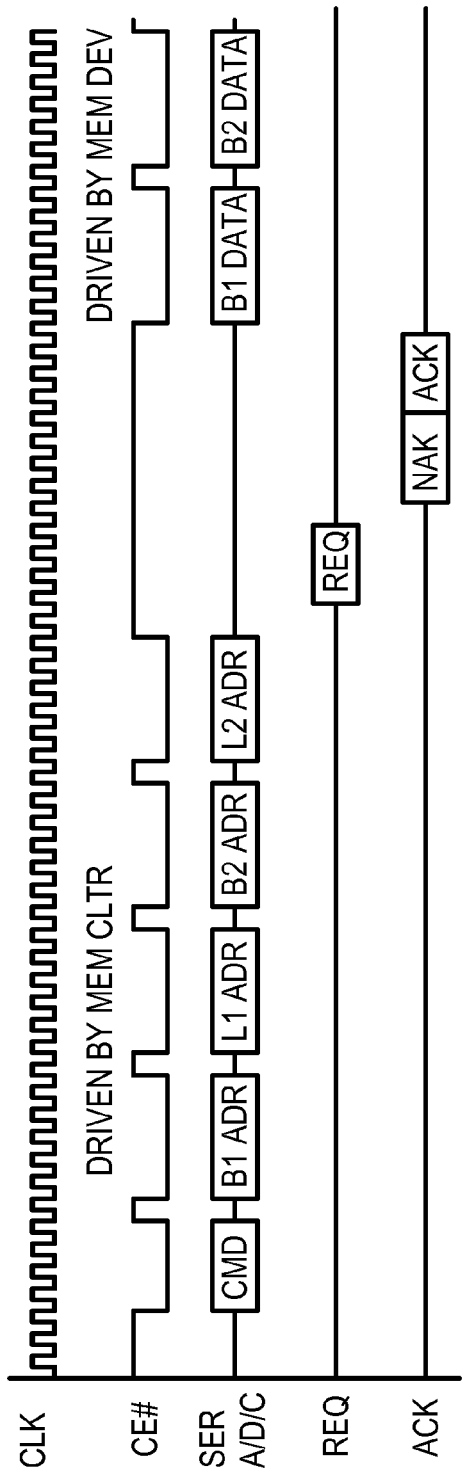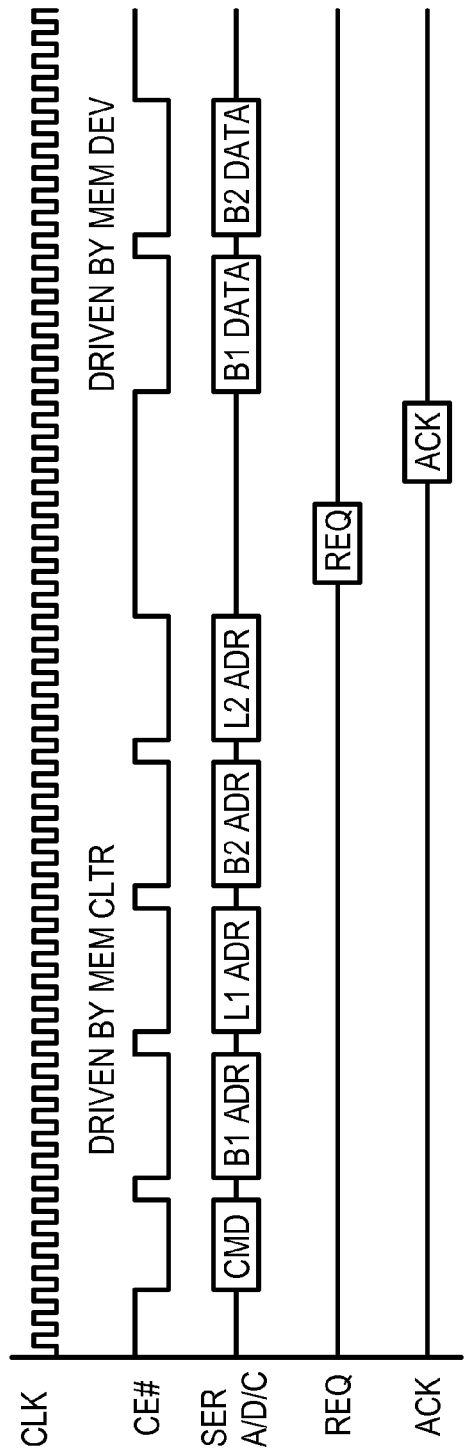

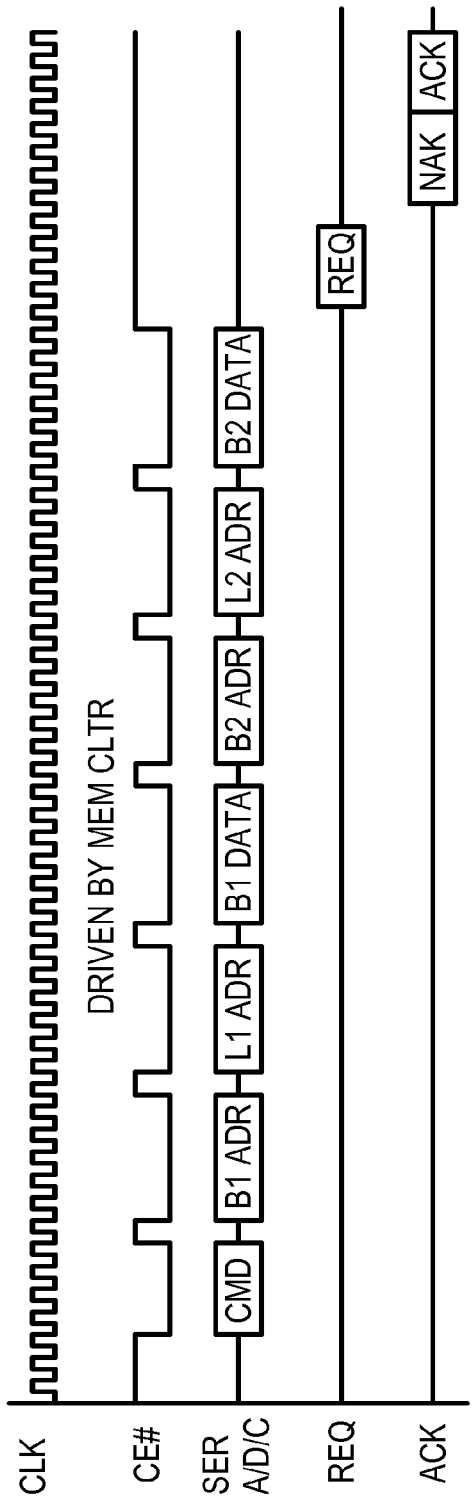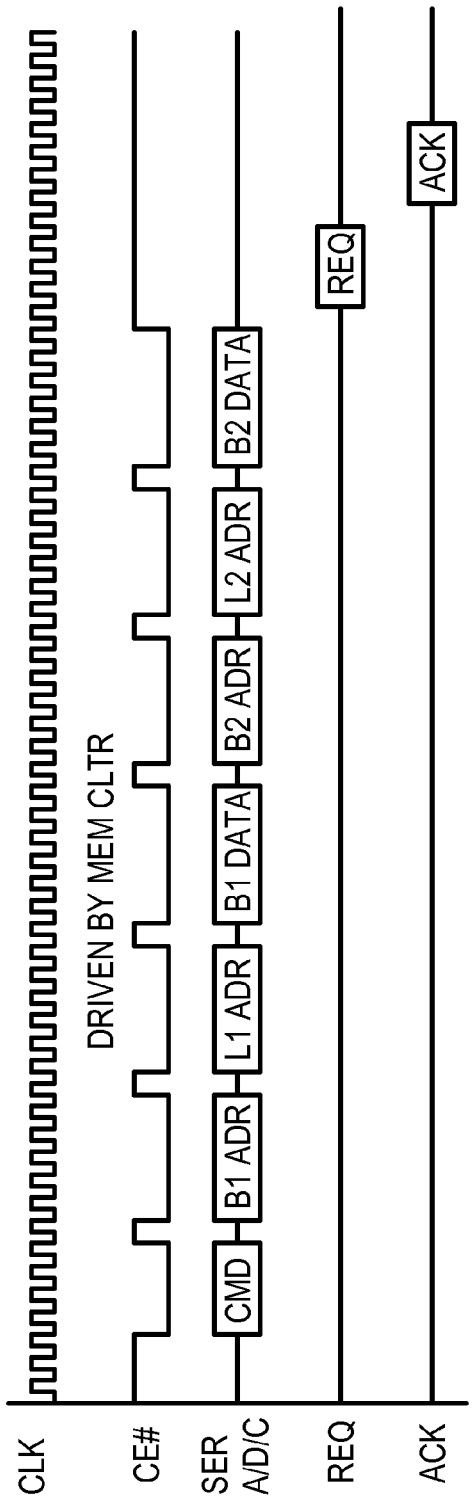

HIGH-SPEED CONTROLLER FOR PHASE-CHANGE MEMORY PERIPHERAL DEVICE

RELATED APPLICATION

This application is a continuation-in-part (CIP) of the co-pending application for "Local Bank Write Buffers for Accelerating a Phase-Change Memory", U.S. Ser. No. 11/748,595 filed May 15, 2007. This application is also a CIP of "Fast Suspend-Resume of Computer Motherboard Using Phase-Change Memory", U.S. Ser. No. 11/740,398, filed Apr. 26, 2007. This application is further a CIP of "Synchronous Page-Mode Phase-Change Memory with ECC and RAM Cache", U.S. Ser. No. 11/769,324, filed Jun. 27, 2007.

FIELD OF THE INVENTION

This invention relates to phase-change memories, and more particularly to token-passing interfaces to page-mode phase-change memories.

BACKGROUND OF THE INVENTION

Traditional memories use parallel interfaces such as multiple bits of address and data. Main memories often use dynamic-random-access memory (DRAM), while faster cache memories and on-chip memories may use static random-access memory (SRAM). Read-only-memory (ROM) may use fuses or masked metal options, or may use electrically-erasable programmable read-only memory (EEPROM) cells. These are randomly-accessible memories since individual words can be read or written without disturbing nearby data. Often individual bytes may be written.

Mass storage memory is block-addressable, where a block of 512 or more bytes must be read or written together as a block. Individual words of 64 bytes or less cannot be separately written without re-writing the whole 512-byte block. Mass storage devices include rotating magnetic disks, optical disks, and EEPROM arranged as flash memory.

Traditionally, flash memory has been used for non-volatile storage. Another kind of non-volatile memory, phase-change memory, was discovered in the 1960's, and was even written about in a paper in Electronics magazine in September 1970 by the founder of Intel Corp., Gordon Moore. However, despite the long-felt need, this 40-year-old technology has not yet been widely used in personal computers and other systems.

Phase-change memory (PCM) uses a layer of chalcogenide glass that can be switched between a crystalline and an amorphous state. The chalcogenide glass layer can be an alloy of germanium (Ge), antimony (Sb), and tellurium (Te). This alloy has a high melting point, which produces the amorphous state when cooled from the melting point. However, when the solid alloy is heated from the amorphous state, the alloy transforms into a crystalline state at a crystallization temperature than is below its melting point. Such heating can be provided by an electric current through the alloy. The state change may occur rapidly, such as in as little as 5 nanoseconds.

One problem with phase-change memory is that write times are data-sensitive. Writing a 1 into a PCM cell may require 100 ns, while writing a 0 to a PCM cell may require only 5 or 10 ns. The cell read time may be relatively short, such as 2-10 ns. Thus writing a 1 to a cell may require 10 times longer than writing a 0 to the cell. This write asymmetry can increase delays that can be mitigated with improved buffering and bank interleaving.

Serial-interface memories are sometimes used for specialized applications, such as for video RAM, where a serial stream of pixels is read out. More recently, fully-buffered dual-inline memory modules (FB-DIMM) have used packet-based interfaces in a daisy chain. These high-speed interfaces require fewer I/O pins that more traditional parallel interfaces.

What is desired is a phase-change memory that compensates for asymmetric write times through an improved serial interface, along with improved buffering and caching. A phase-change memory interface designed for data-sensitive write delays is desired.

BRIEF DESCRIPTION OF THE DRAWINGS

FIG. 1 shows a phase-change memory cell.

FIG. 8 is a flowchart of processing a burst read command by a page-mode PCM device with a token-stub interface.

FIGS. 12A-B are timing diagrams of hits and a miss for reads of a two banks of PCM.

FIGS. 13A-B are timing diagrams of hits and a miss for writes to two banks of PCM.

DETAILED DESCRIPTION

Figure 2:
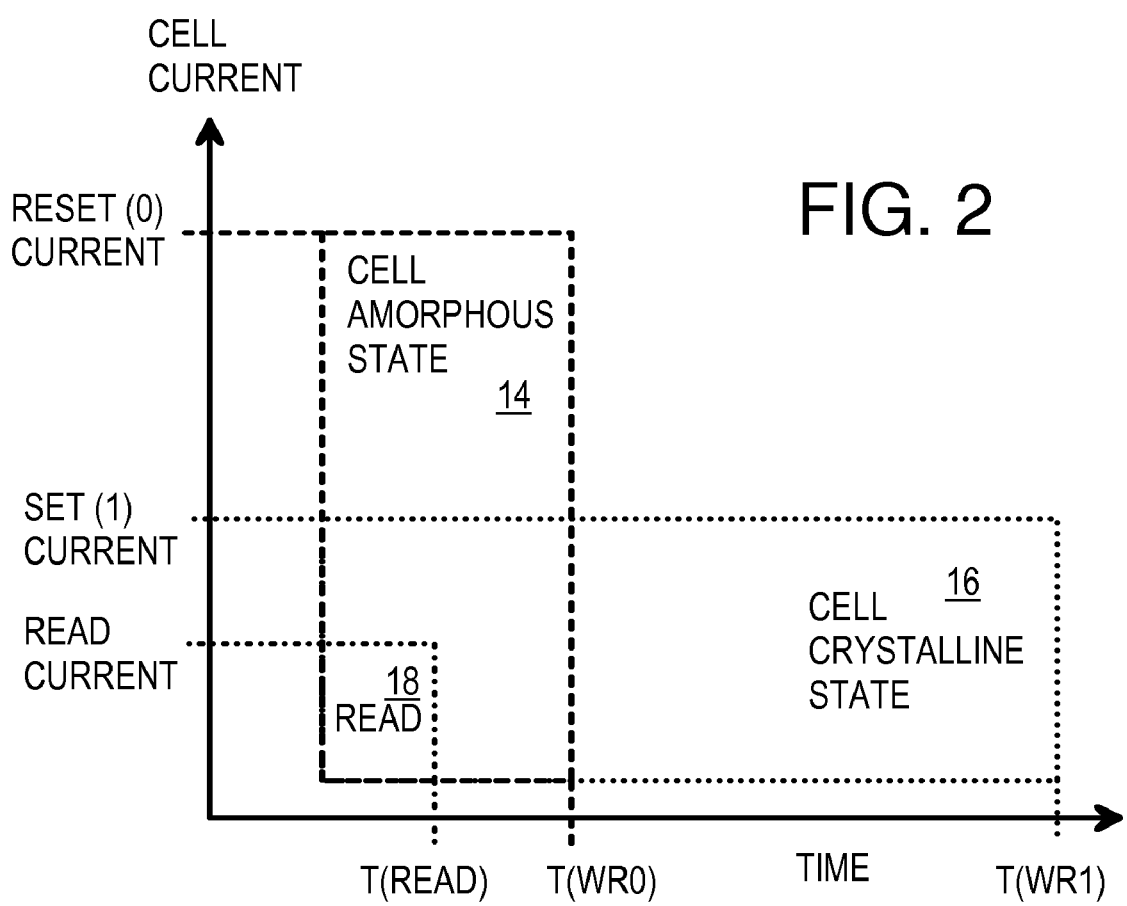
FIG. 2 is a graph of current and time to transform states in a phase-change memory cell.

The present invention relates to an improvement in phase-change memory interfaces. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Phase-Change Memory—FIGS. 1-4

FIG. 1 shows a phase-change memory cell. Phase-change memory (PCM) uses a layer of chalcogenide glass that can be switched between a crystalline and an amorphous state. The chalcogenide glass layer can be an alloy of germanium (Ge), antimony (Sb), and tellurium (Te). This alloy has a high melting point, which produces the amorphous state when cooled from the melting point. However, when the solid alloy is heated from the amorphous state, the alloy transforms into a crystalline state at a crystallization temperature than is below its melting point. Such heating can be provided by an electric current through the alloy. The state change may occur rapidly, such as in as little as 5 nanoseconds.

In FIG. 1, when alloy resistor 10 is in the crystalline state, its resistivity is low. The crystalline state represents a logic high or 1. A PCM memory cell has alloy resistor 10 in series with select transistor 12 between a bit line BL and a voltage V. When V is a low voltage such as ground, and word line WL is driven high, the bit-line voltage is pulled from a high pre-charged state to ground through select transistor 12 and alloy resistor 10 due to the low resistance of alloy resistor 10.

When alloy resistor 10' is in the amorphous state, its resistivity is high. The amorphous state represents a logic low or 0. Another PCM memory cell has alloy resistor 10' in series with select transistor 12' between a bit line BL and a voltage V. When V is a low voltage such as ground, and word line WL is driven high, the bit-line voltage remains in its high or pre-charged state, since the high resistance of alloy resistor 10' limits current through select transistor 12'.

Note that the assignment of logical 0 and logic 1 states to the crystalline and amorphous states is arbitrary. The crystalline state could be assigned logical 1 or logical 0, with the amorphous state having the opposite logical value.

Alloy resistor 10 may be a small layer that is integrated with select transistor 12, such as a layer over or near the source terminal of transistor 12. Alternately, alloy resistor 10 may be a separate resistor device, such as a patterned line or snaking line between the source of select transistor 12 and ground.

When a high current is passed through alloy resistor 10, the alloy can transform from the crystalline state into the amorphous state. The high current creates resistive heating in alloy resistor 10 and the melting temperature is rapidly reached, causing the crystal to melt into a liquid. Upon rapid cooling, alloy resistor 10 solidifies into the amorphous state since there is little time for crystals to grow during cooling.

When a lower current is passed through alloy resistor 10 for a long period of time, the crystalline temperature is reached or exceeded. However, the current is not sufficient to cause the higher melting temperature to be reached. The amorphous alloy begins to crystallize over this long time period. For example, small crystal domains within the amorphous state may grow and absorb other domains until alloy resistor 10 contains one or just a few crystal domains.

Thus alloy resistor 10' transforms from the high-resistance amorphous state into the low-resistance crystalline state by applying a moderate current for a relatively long period of time, allowing the crystal to grow at the crystalline temperature. Alloy resistor 10 transforms from the low-resistance crystalline state into the high-resistance amorphous state by applying a high current for a relatively short period of time, allowing the crystal to melt into an amorphous blob at the melting temperature.

FIG. 2 is a graph of current and time to transform states in a phase-change memory cell. Amorphous state 14 is reached when a high current (the reset current) is applied for a time of T(WR0). Crystalline state 16 is reached when a moderate current, the set current, is applied for a longer period of time T(WR1). These states are retained when currents below the moderate current are applied, or when currents are applied for short periods of time. State transformations, or partial state transformations, may occur when the full currents and times are not both met, such as applying the set current for less than the set time. These partial state transformations are undesirable.

The PCM cell can safely be read by applying a lower read current for a short period of time. For example, the read current can be less than either the set or reset currents. Reading 18 has the read current applied for less than the set or reset times, T(WR1), T(WR0), respectively. For example, the read time T(READ) can be less than half of the reset time, and the read current can be less than half of the set current. The reset current can be double or more the set current, and the set time can be double, triple, 5×, or more of the reset time.

Since the set time T(WR1) is so much longer than the reset time T(WR0), the time to write a memory cell is dependent on the data itself. Since data often contains both 1's and 0's, both setting and resetting can occur for the same data word. The reset time can overlap with the longer reset time, allowing both set and reset to overlap in time. Then the overall write time is determined by the longer set period of time.

Figure 3:
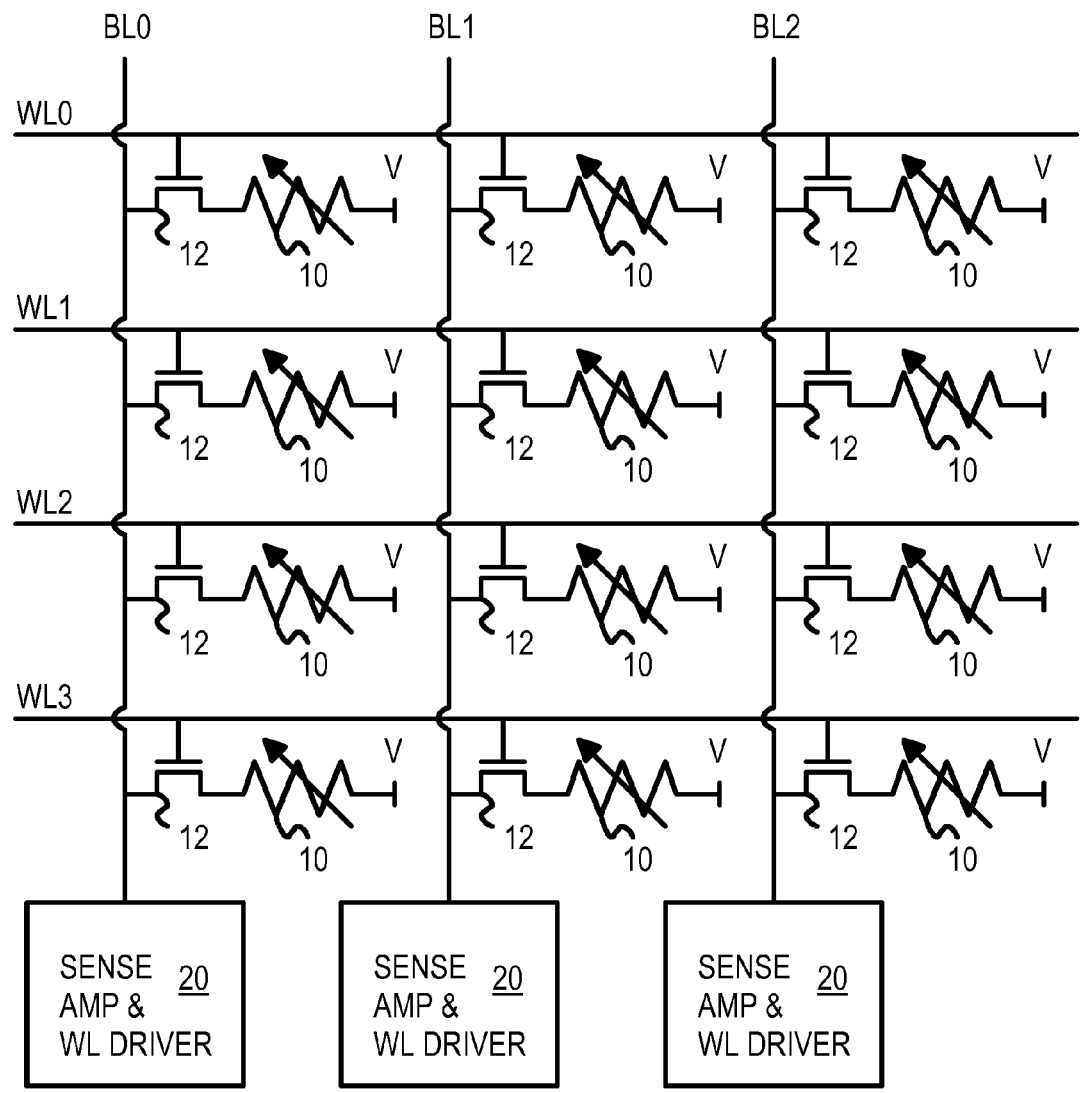
FIG. 3 shows an array of phase-change memory cells.

FIG. 3 shows an array of phase-change memory cells. Word lines WL0:3 are applied to the gates of select transistors 12, while bit lines BL0:2 connect to the drains of select transistors 12. Alloy resistors 10 are in series between the sources of select transistors 12 and a cell voltage V, which could be ground, power, or some other voltage, and could be switched on and off, such as for power down or to disable an array or block.

Alloy resistors 10 each can be in a high-resistance amorphous state, or in a low-resistance crystalline state. The current drawn from a bit line by select transistor 12 and alloy resistor 10 in the selected word line (row) is sensed by sense amplifiers 20 and amplified and buffered to generate the data read from the cell. The current drawn through alloy resistor 10 is less than or equal to the read current.

During writing, sense amplifiers 20 activate bit-line drivers that drive the set or reset current onto the bit lines and through the selected alloy resistor. After the current is applied for the set or reset time, alloy resistor 10 is transformed into the new state, either the amorphous or crystalline state. One cell per column is written, since only one of the word lines is activated at a time. Columns being written into the 0 state have the reset current applied to the bit line for the reset time period, while columns being written into the 1 state have the set current applied for the set time period.

Figure 4:
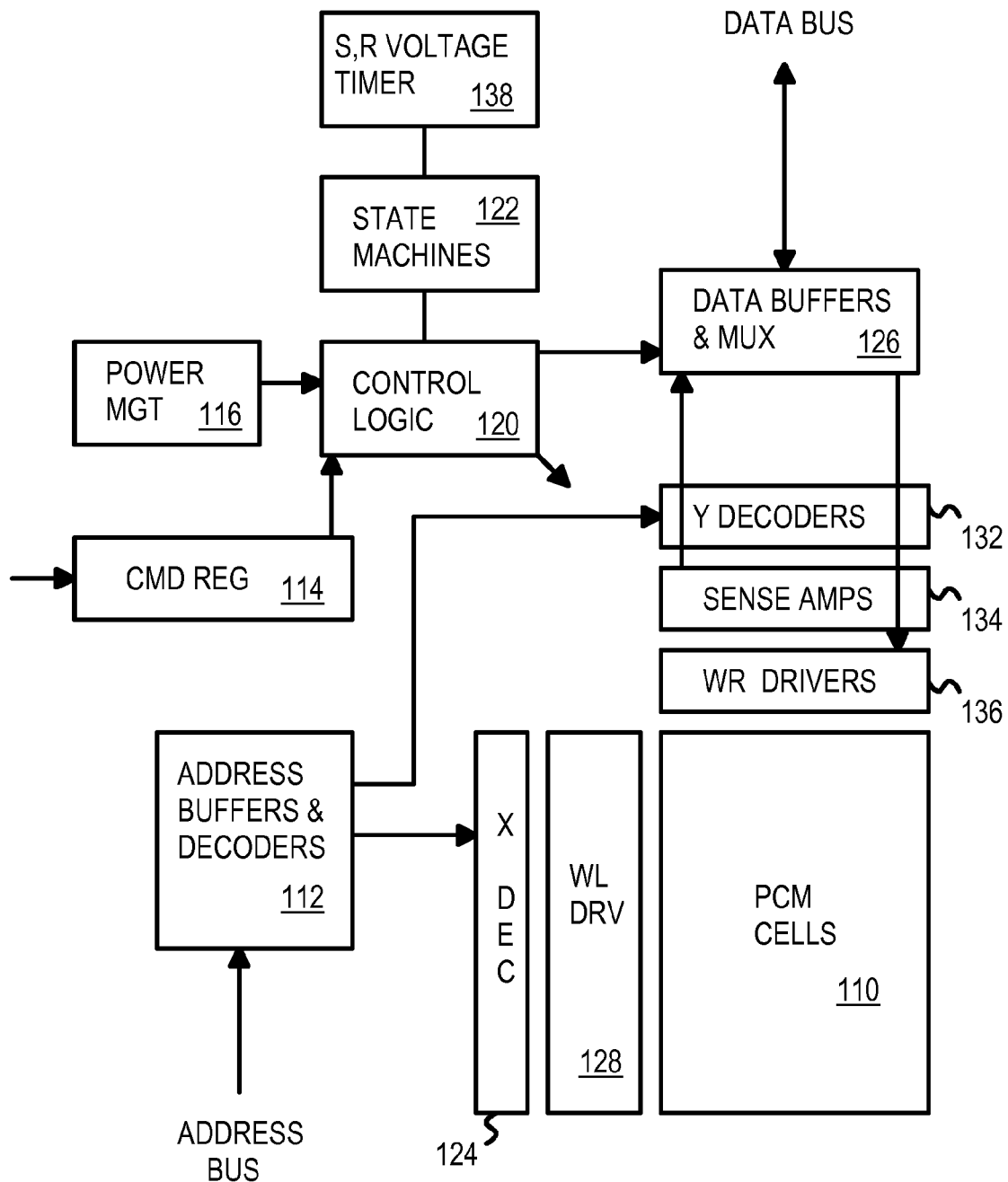
FIG. 4 shows a phase-change memory.

FIG. 4 shows a phase-change memory. A PCM chip may include some or all of the blocks shown in FIG. 4, and other blocks, or some of the functions may be performed by a separate PCM controller.

PCM cells 110 form an array of rows and columns of select transistors and alloy resistors that change between crystalline and amorphous phase states. The high and low resistance values of the 2 phase states are sensed by sense amplifiers 134 when a read current is drawn through a selected row of PCM cells. Word line drivers 128 drives one row or word line in PCM cells 110 while the other rows are disabled. A row portion of an address applied to address decoder 112 is further decoded by X decoder 124 to select which row to activate using word line drivers 128.

A column portion of the address applied to address decoder 112 is further decoded by Y decoder 132 to select a group of bit lines for data access. Data buffers 126 may be a limited width, such as 64 bits, while PCM cells may have a larger number of bit lines, such as 8×64 columns. One of the 8 columns may be selected by Y decoder 132 for connection to data buffers 126.

During writing, external data is collected by data buffers 126 and applied to write drivers 136. Write drivers 136 generate voltages or currents so that the set currents are applied to bit lines for PCM cells that are to be written with a 1, while higher reset currents are applied to bit lines for PCM cells to be reset to 0.

Set, reset voltage timer 138 includes timers that ensure that the set currents are applied by write drivers 136 for the longer set period of time, while the reset currents are applied for the shorter reset time period, and write drivers 136 for reset PCM cells are disabled after the reset time period. Both set and reset currents could be applied at the same time, such as for a period that the reset pulse overlaps the longer set pulse. Alternately, set and reset pulses could be non-overlapping. This may reduce peak currents, but increase write times. Since the reset time is perhaps one-tenth of the set time, write delays may increase by 10% or so.

State machines 122 can activate set, reset voltage timers 138 and cause control logic 120 to disable write drivers 136 after the set and reset time periods have expired. State machines 122 can generate various internal control signals at appropriate times, such as strobes to pre-charge bit lines and latch sensed data into data buffers 126.

Command register 114 can receive commands that are decoded and processed by control logic 120. External control signals such as read/write, data strobes, and byte enables may also be received in some embodiments. Command register 114 may be replaced by a command decoder in some embodiments. Power management unit 116 can power down blocks to reduce power consumption, such as when the PCM chip is de-selected. Since PCM cells 110 are non-volatile, data is retained when power is disconnected.

There may be several arrays of PCM cells 110 and associated logic on a large PCM chip. An array-select portion of the address can be decoded by address decoders 112 to enable one of the many arrays or blocks on the PCM chip.

Figure 5:
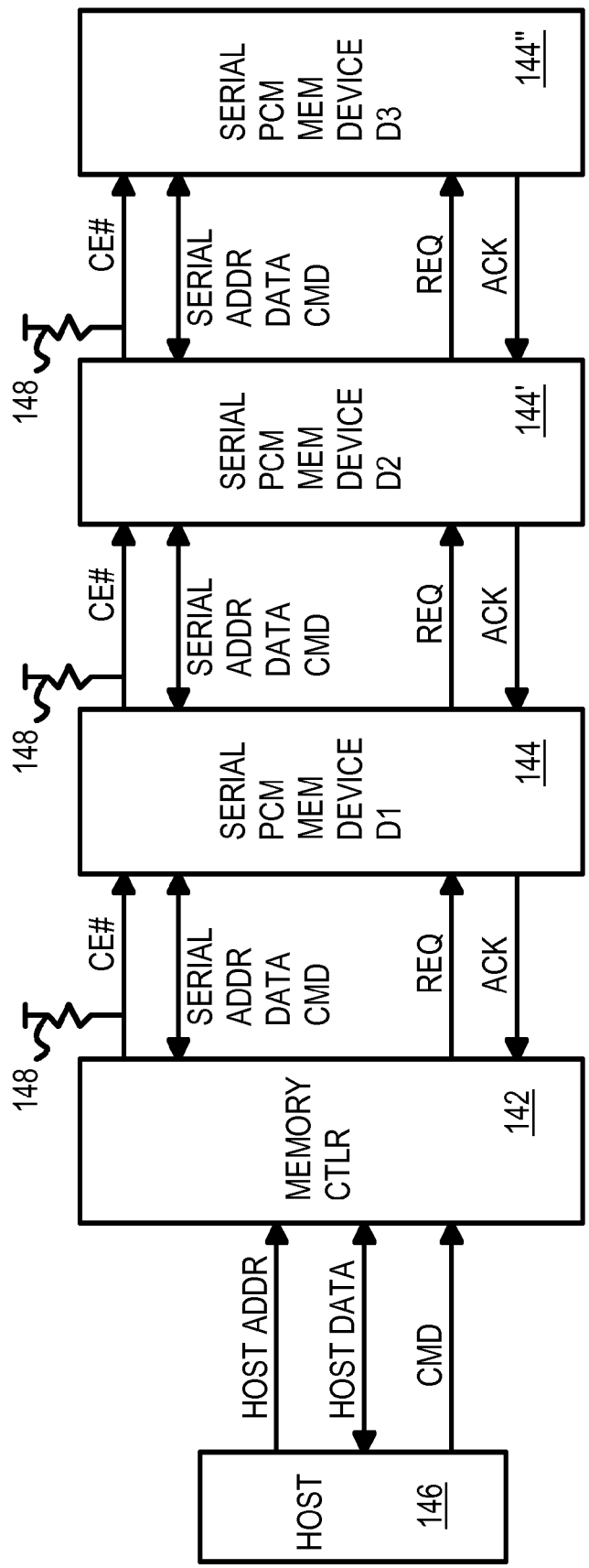
FIG. 5 shows PCM devices connected to a host using a token-stub arrangement.

Token-Stub Interface—FIG. 5

Traditional token-ring systems contain devices in a loop or ring. A token is passed around the ring in a clock-wise or in a counter-clock-wise direction, allowing each device in the ring to conduct a bus transaction when it receives the token.

Rather than arrange the devices in a loop or ring, the inventors arrange devices in a stub that has an endpoint. A traditional token ring has no endpoint since the devices are in a looping ring. The inventors have discovered that a token-stub arrangement allows for better interfacing to a memory controller while retaining many of the control benefits of a token-ring. Latency to devices closer to the memory controller is improved relative to a ring arrangement.

FIG. 5 shows PCM devices connected to a host using a token-stub arrangement. Host 146 generates commands for host data and host addresses that are sent to memory controller 142. Memory controller 142 examines the host address and partially decodes the host address to generate chip-enable (CE#) signals that select a stub segment of PCM chips 144, 144', 144". Pullup resistors 148 on each CE signal line pull CE high (inactive) when neither the upstream nor the downstream PCM device is driving CE. Thus either device may drive CE as needed.

Memory controller 142 generates a serialized address from the host address, and arranges the host data and command as a serial sequence to send to first PCM chip 144. When first PCM chip 144 does not store the requested data, the request is forwarded on to second PCM chip 144' over the serial interface between PCM chips 144, 144'. First PCM chip 144 activates CE# to second PCM chip 144' and activates the request line REQ to second PCM chip 144', which responds by activating its acknowledgement (ACK) line back to first PCM chip 144 when second PCM chip 144' passes data back to first PCM chip 144 for transfer to host 146.

However, when first PCM chip 144 does store a copy of the requested data, then first PCM chip 144 can respond to the host's request, generating CE# and an ACK back to memory controller 142 when the read data is ready for transfer, or when the write data has been latched.

When second PCM chip 144' does not contain the requested data, then second PCM chip 144' activates CE# to third PCM chip 144". Second PCM chip 144' sends the serialized address and command to third PCM chip 144" and activates REQ to third PCM chip 144". Third PCM chip 144" can then read or write the data and reply with CE# and an ACK back to second PCM chip 144'. Second PCM chip 144' forwards the reply and any read data from third PCM chip 144" back to first PCM chip 144, and first PCM chip 144 sends the ACK back up to memory controller 142.

Thus serialized requests are passed down the token-stub of PCM chips 144, 144', 144" until the PCM chip containing the requested address is found. The target PCM chip generates an acknowledgement which is passed back up the token-stub to memory controller 142, which generates the response to host 146.

While host 146 has a parallel interface to memory controller 142, PCM devices 144, 144', 144" on the token stub have serialized interfaces. Request-acknowledgement handshaking is performed by PCM chips 144, 144', 144" but not by memory controller 142 to host 146.

Figure 6:
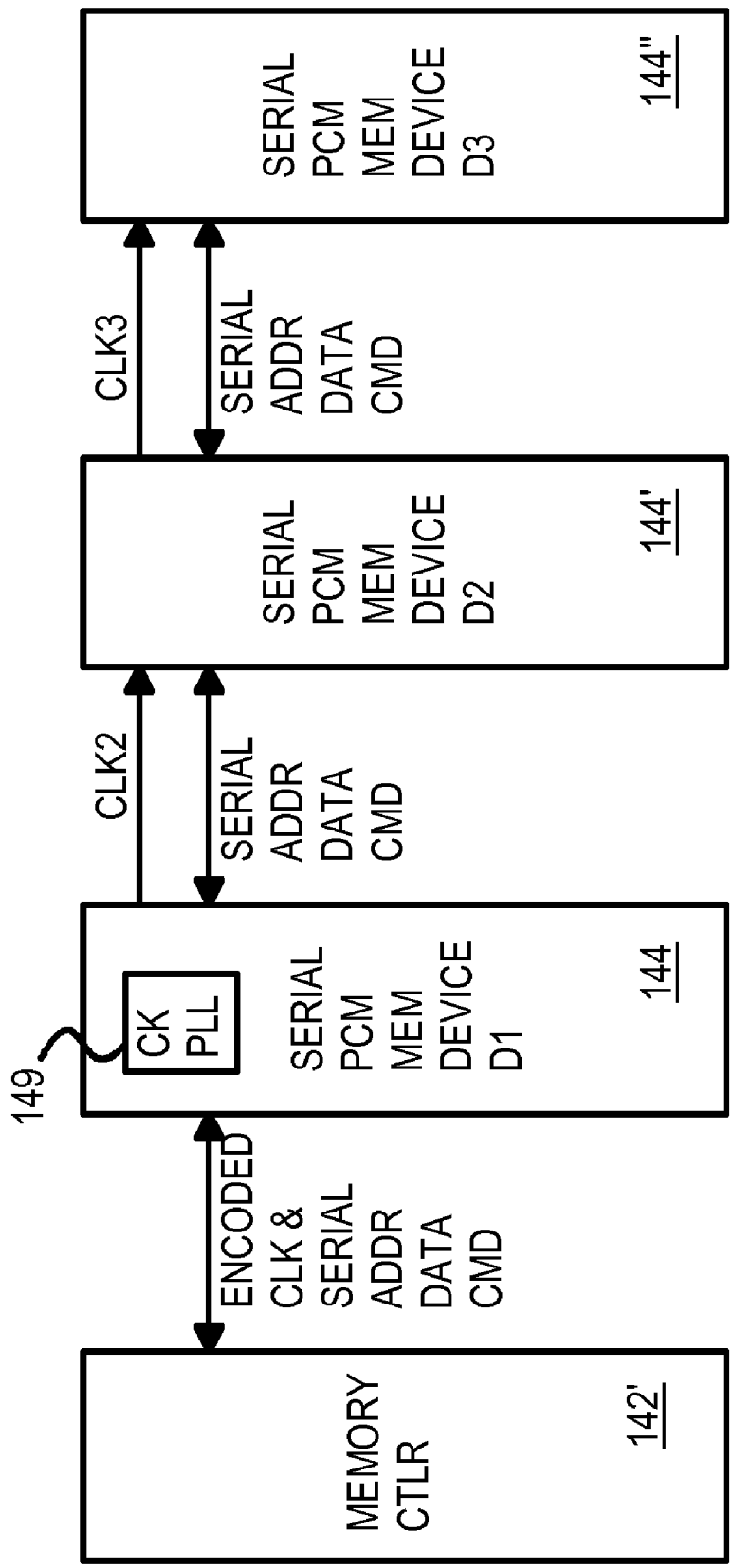
FIG. 6 shows clock extraction from clock-encoded data from a memory controller.

FIG. 6 shows clock extraction from clock-encoded data from a memory controller. While a system clock could be applied to each of PCM chips 144. 144', 144", the clock could be extracted from a clock-encoded data stream. Memory controller 142' may combine the system clock and the serialized data/address/command sent to first PCM chip 144 as an encoded serial stream. Various encoding schemes such as not-return-to-zero (NRZ) may be employed to combine the clock and data, and the data stream may be run-length encoded or otherwise altered for better encoding with the clock.

A phase-locked loop (PLL) in first PCM chip 144 receives the encoded serialized data stream from memory controller 142 and extracts the clock. Clock-extracting PLL 149 generates a local clock CLK2 that is passed on to second PCM chip 144'. Second PCM chip 144' buffers this clock on to third PCM chip 144" as CLK3. These clocks may be used internally by PCM chips 144, 144', 144" for data retransmission, memory accessing, and other functions.

Figure 7A:
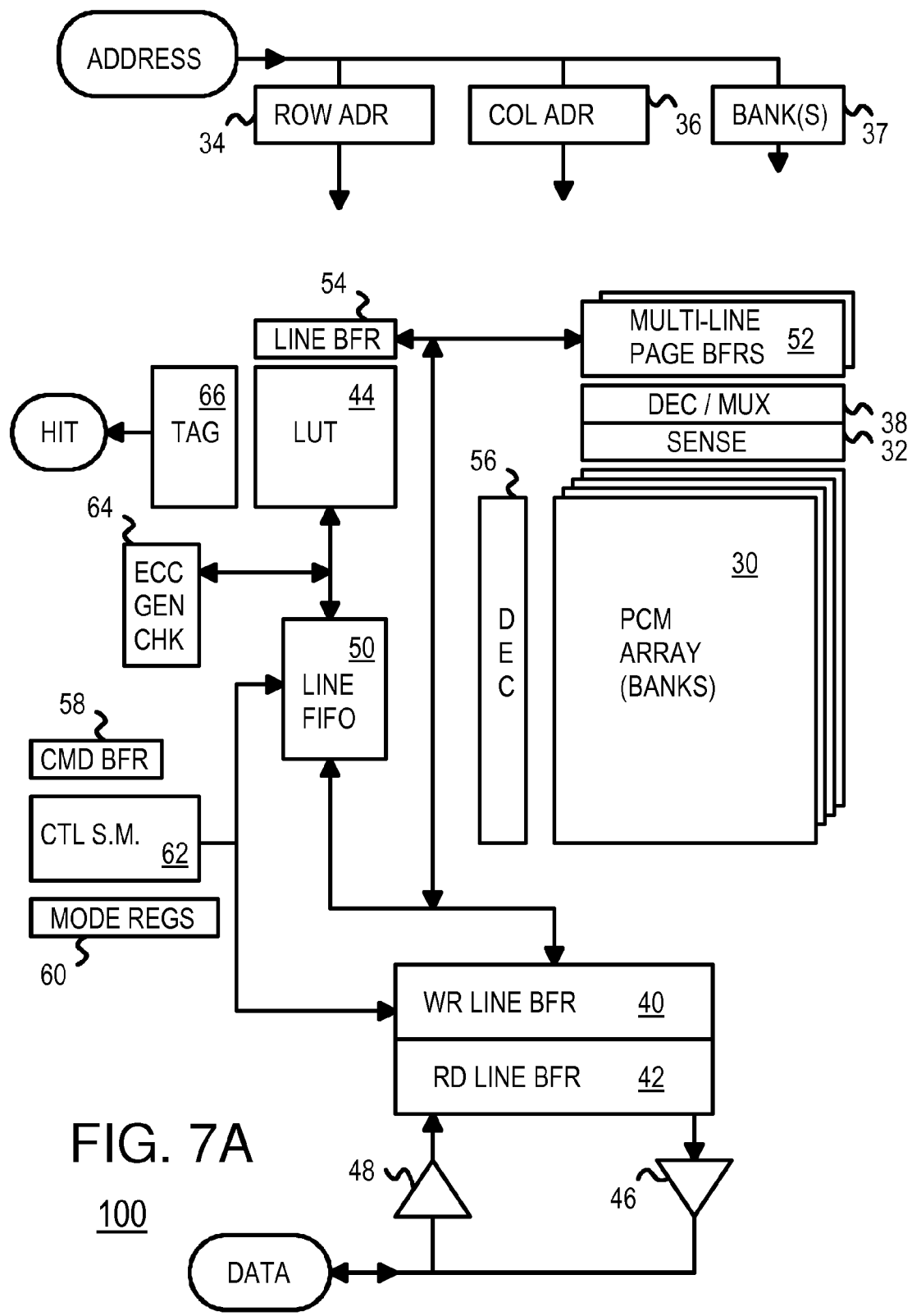
FIGS. 7A-B show a block diagram of a page-mode caching phase-change memory device with a token-stub interface.
Figure 7B:
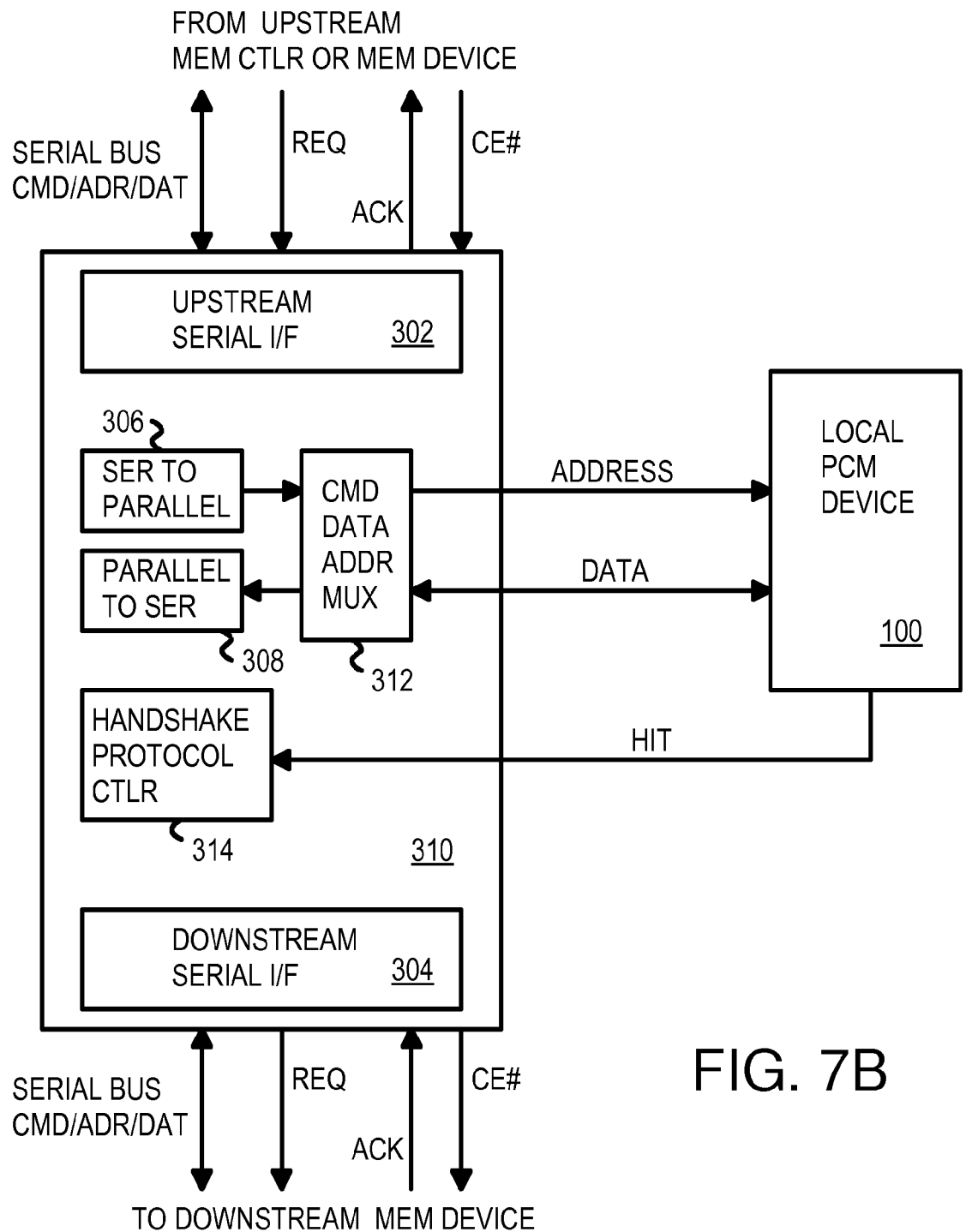

Block Diagram—FIGS. 7A-B

FIGS. 7A-B show a block diagram of a page-mode caching phase-change memory device with a token-stub interface. The PCM device of FIGS. 7A-B may be used as PCM chips 144. 144', 144" of FIGS. 5-6 or in other applications such as a stand-alone memory device, or a device in an array of memory devices. FIG. 7 shows local PCM block 100 which can be a block inside the PCM chip shown in FIG. 7B with the serialized token-stub interface. The serialized token-stub interface is highlighted in FIG. 7B, while local PCM block 100 is highlighted in FIG. 7A.

In FIG. 7A, a parallel input address is divided into 3 parts. The upper 8 address bits in row decode buffer 34 are applied to row decoders to each of PCM banks 30. The row decoders select one of the 256 word lines in each bank of PCM banks 30.

The middle 5 address bits in column decode buffer 36 are applied to column decoders to each of PCM banks 30. The column decoders select one of the 32 byte-wide columns of bits lines in each of PCM banks 30.

The lower address bits in bank-address buffer 37 select one or more of the PCM banks for access. Additional logic, such as control logic or address sequencing logic (not shown), may alter the address bits in bank-address buffer 37 to activate several of PCM banks 30 at the same time to write in multiple bytes at a time.

Each PCM bank 30 in the PCM array has row decoder 56 and column decoder and muxing 38 to select one byte of memory cells for reading or writing. Sense amplifiers 32 each sense pairs of bit lines that connect to memory cells to read bits of data. The read data can be latched or buffered by multi-line page buffers 52 before being transferred over data lines to read line buffer 42. Read data from read line buffer 42 is driven outside of local PCM block 100 by output buffers 46.

Parallel write data enters local PCM block 100 through input buffers 48 and are stored in write line buffers 40. Write line buffers 40 can be one or more line buffers, such as four buffers of 4 bytes per buffer when lines are 4 bytes. The width each buffer in write line buffers 40 can match the width of data lines to multi-line page buffers 52. When the width of the external Data I/O differs, two or more external bus cycles may be needed to fill each 4-byte buffer in write line buffer 40. For example, a 16-bit external data bus requires 2 bus cycles to fill each 4-byte buffer in write line buffers 40, while a 32-bit external bus requires only 1 bus cycle.

Each of PCM banks 30 may also contain a local bank write latch. The bits lines in each PCM bank 30 may then be driven by write drivers from the data in the bank write latch. Once the data is latched and stored in the local bank write latch, data for a different bank in PCM banks 30 may be sent over the data lines between PCM banks 30 and multi-line page buffers 52.

Since the data is stored locally with each bank, the slow set-write process can occur concurrently with data transfers to other banks. Data throughput for slow phase-change writes into the crystalline state is vastly improved by local write-data storage at the interleaved banks. Sufficient time for growing crystals in the alloy resistors is provided without blocking other writes and data transfers.

However, data access of PCM banks 30 may still be relatively slow, especially for writes that require re-crystallization of the alloy resistors. A small cache lookup table (LUT) may be provided to speed up accesses. Data from write line buffer 40 may be sent to line FIFO 50 for writing into LUT 44, rather than being written directly into PCM banks 30. Tags 66 can store address tags for lines of data stored in LUT 44, and during reads data can be provided from LUT 44 to read line buffer 42 when a hit occurs in tags 66.

LUT 44, tags 66, line buffer 54, multi-line page buffers 52, and line FIFO 50 can be small static random-access memories (SRAM) or registers or other hardware memory. They could be partitions of a larger SRAM array, or could be separate physical blocks of memory on a PCM device.

When a line in LUT 44 is to be evicted to make space in LUT 44 for new data, the old line is sent to line buffer 54, and then transferred to multi-line page buffers 52 for writing into PCM banks 30. When data is allocated to LUT 44, the old data is read from PCM banks 30 into multi-line page buffers 52, and then written into LUT 44, either through line FIFO 50 or line buffer 54 or directly.

ECC controller 64 can generate ECC bytes for host data from line FIFO 50 that is being stored in LUT 44, and can also check data fetched from PCM banks 30 for errors, and correct any errors when the fetched data is being written into LUT 44, or after the data has been written into LUT 44.

Commands extracted from the data stream from the host or external memory controller may be sent to local PCM block 100 and latched into command buffer 58. Configuration and other mode data may be written into mode registers 60. Control state machine 62 performs a sequence of internal operations that are needed to perform the command in command buffer 58. Fairly complex logic and multiple levels of state machines may be used for control of the many buses and blocks in local PCM block 100.

In FIG. 7B, serializing token-stub interface 310 converts serialized address/data/commands into parallel address and data to local PCM block 100 (shown in detail in FIG. 7A). Serialized address/data/commands in a serial bitstream from memory controller 142 or the upstream PCM chip 144 (FIG. 5) are received by upstream serial interface 302 when the chip-enable CE# is activated and the request REQ signaled. Upstream serial interface 302 also sends replies back upstream to memory controller 142 or to the upstream PCM chip 144 (FIG. 5) by activating the acknowledgement ACK signal and CE#.

Serialized address/data/commands that do not map into addresses in local PCM block 100 are passed through serializing token-stub interface 310 from upstream serial interface 302 to downstream serial interface 304. Downstream serial interface 304 connects to the next downstream PCM chip 144'. Downstream serial interface 304 generates the chip-enable CE# and request REQ signals to the next PCM chip. Downstream serial interface 304 also receives replies when CE# and ACK are activated. These replies are forwarded by upstream serial interface 302 back upstream to memory controller 142 or to the upstream PCM chip 144 (FIG. 5) by activating the upstream acknowledgement ACK signal.

When the request is for an address in local PCM block 100, serial-to-parallel converter 306 generates parallel address, data, and commands from the serialized data from upstream serial interface 302. Mux 312 separates the data and addresses that are applied as the parallel address and parallel data to local PCM block 100. Commands can be sent as data to local PCM block 100. Reply data read from local PCM block 100 is serialized by parallel-to-serial converter 308 and sent to upstream serial interface 302 for inclusion in an acknowledgement reply to the memory controller.

When the address hits in the RAM cache rather than in the PCM array of local PCM block 100, the reply can be generated more quickly. A hit signal from LUT 44 (FIG. 7A) can be sent to handshake protocol controller 314 to cause the acknowledgement to be generated more quickly when a hit occurs.

Figure 9:
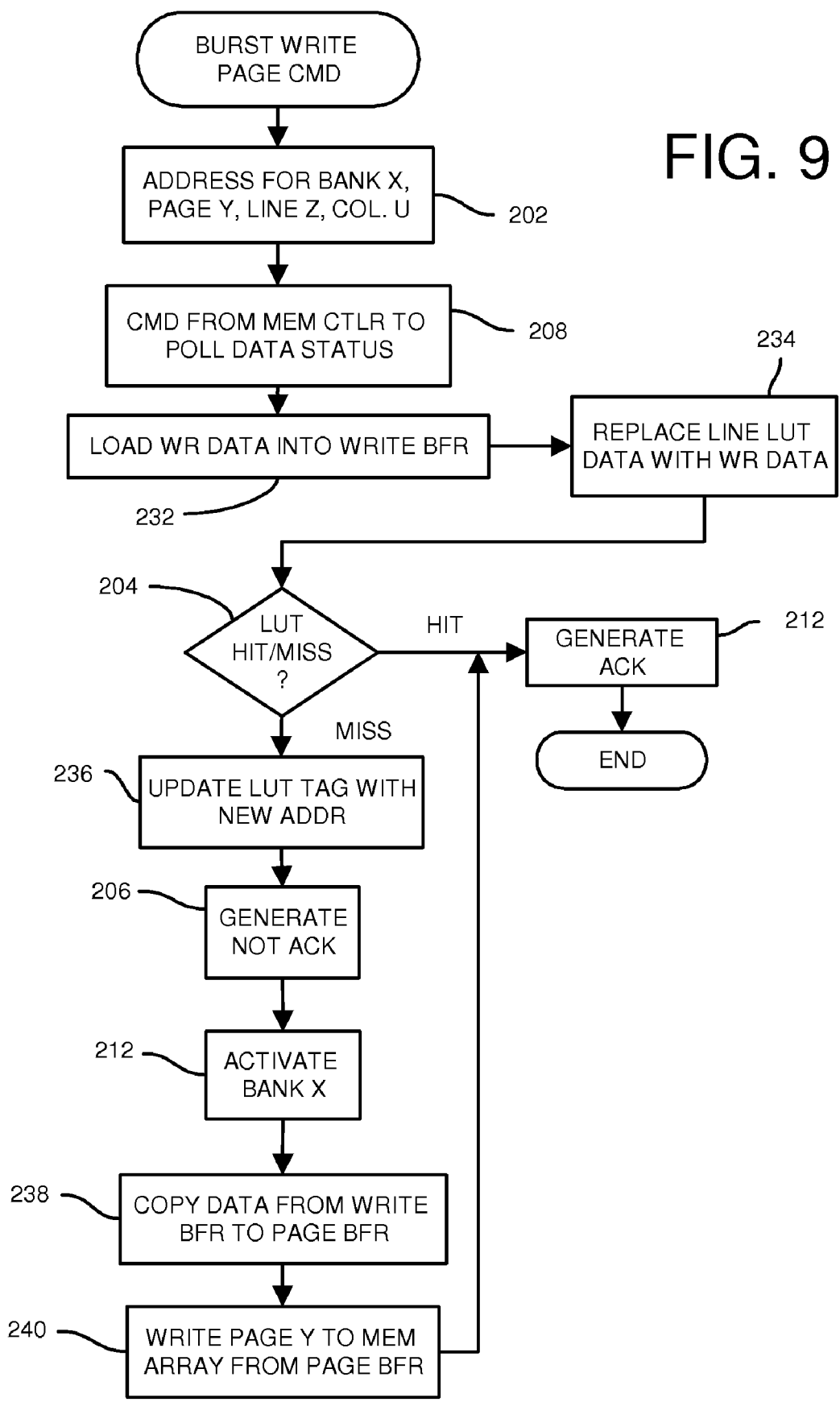
FIG. 9 is a flowchart of processing a burst write command by a page-mode PCM device with a token-stub interface.

Flowcharts of Command Operations—FIGS. 8-9

FIG. 8 is a flowchart of processing a burst read command by a page-mode PCM device with a token-stub interface. A burst-read command is the next command to be processed. The burst read's start address is read from the mode register, step 202. This address can be broken down into a bank X address, a page Y address, a line Z address, and a column U address. After the memory controller has sent the command and address, the memory controller issues a poll command to check the data status to see when the read data is ready, step 208.

A tag portion of the start address is compared to tags in the LUT, step 204, to determine if a hit or miss occurs in the LUT. Valid bits for LUT lines may also be examined with the tags.

When a hit occurs, step 204, then the data may be read directly from the LUT, step 212, and sent to the host, such as through the read line buffer and upstream serial interface 302 (FIG. 7B). The acknowledgement ACK signal is generated by upstream serial interface 302, step 220, and the read data is converted to serial format and sent upstream by upstream serial interface 302, step 224. The burst address is incremented until the end of the burst page address is reached, and the burst read command ends.

When a LUT miss occurs, step 204, then the requested data is not in the LUT. The acknowledgement ACK signal is de-asserted to allow more time for reading the slower PCM banks, step 206. The bank X address is decoded to activate the selected PCM bank, step 212, and the requested data is read into the multi-line page buffers, step 214. The fetched data is sent toward the host through the read line buffer and upstream serial interface 302, and to the LUT through the line buffer.

Once the end of the burst is reached, then the acknowledgement ACK is generated, step 220. The tags for this line in the LUT are also updated with the new address. The read data is converted to serial format and sent upstream by upstream serial interface 302, step 224.

FIG. 9 is a flowchart of processing a burst write command by a page-mode PCM device with a token-stub interface. A burst-write command is the next command to be processed. The burst write's start address is read from the mode register, step 202. This address can be broken down into a bank X address, a page Y address, a line Z address, and a column U address. After the memory controller has sent the command, data, and address, the memory controller issues a poll command to check the data status to see when the write data has been written, step 208.

The write data is converted from serial to parallel format and loaded into the write buffer, step 232. The data is also written into the LUT, step 234, regardless of whether a hit or a miss occurs.

A tag portion of the start address is compared to tags in the LUT, step 204, to determine if a hit or miss occurs in the LUT. Valid bits for LUT lines may also be examined with the tags.

When a LUT hit occurs, step 204, then the host data can quickly be stored in the LUT, and the acknowledgement ACK quickly generated, step 212. Once the end of the burst is reached, the burst write ends. The host data is stored only in the LUT, not in the PCM banks on a LUT hit.

When a miss occurs, step 204, the host data was still written directly to the LUT from the write line buffer, step 234. The LUT tag is updated with the new host address, step 236. An empty line in the LUT may be allocated for this new host data.

The acknowledgement ACK signal is de-asserted to allow more time for reading the slower PCM banks, step 206. The bank X address is decoded to activate the selected PCM bank, step 212, and the write data is copied from the write buffer into the page buffer, step 238. The write data is then written from the page buffer into the selected PCM bank, step 240.

Once the end of the burst is reached, then the acknowledgement ACK is generated, step 212, and the write operation ends. The write data is stored in both the LUT and the PCM banks on a miss.

Timing Diagrams—FIGS. 10-15

Figure 10A:
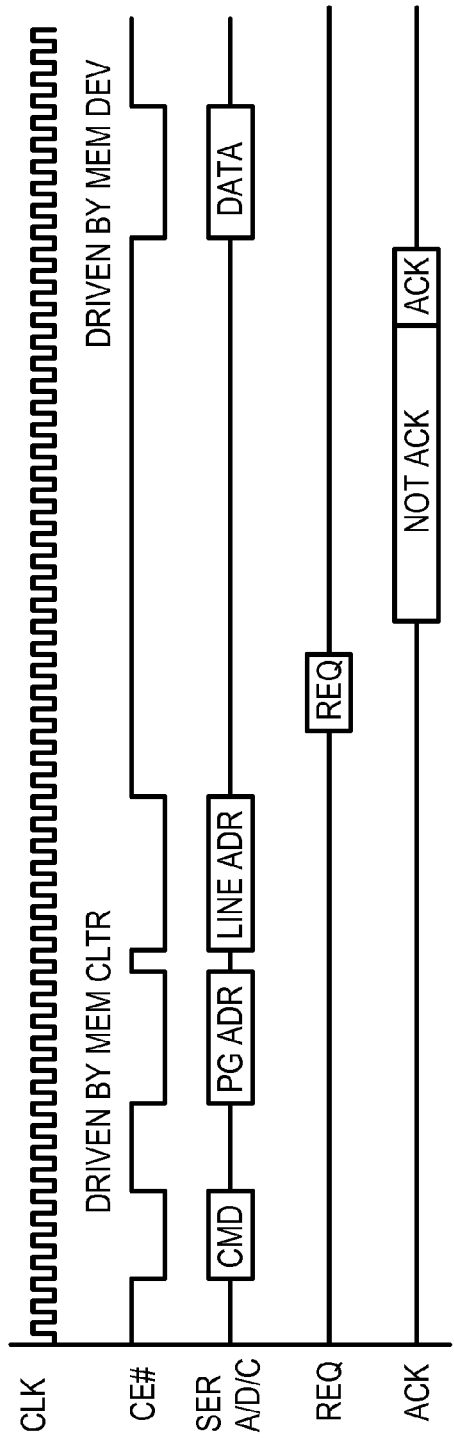
FIGS. 10A-B are timing diagrams of hits and a miss for reads of a single bank of PCM.
Figure 10B:
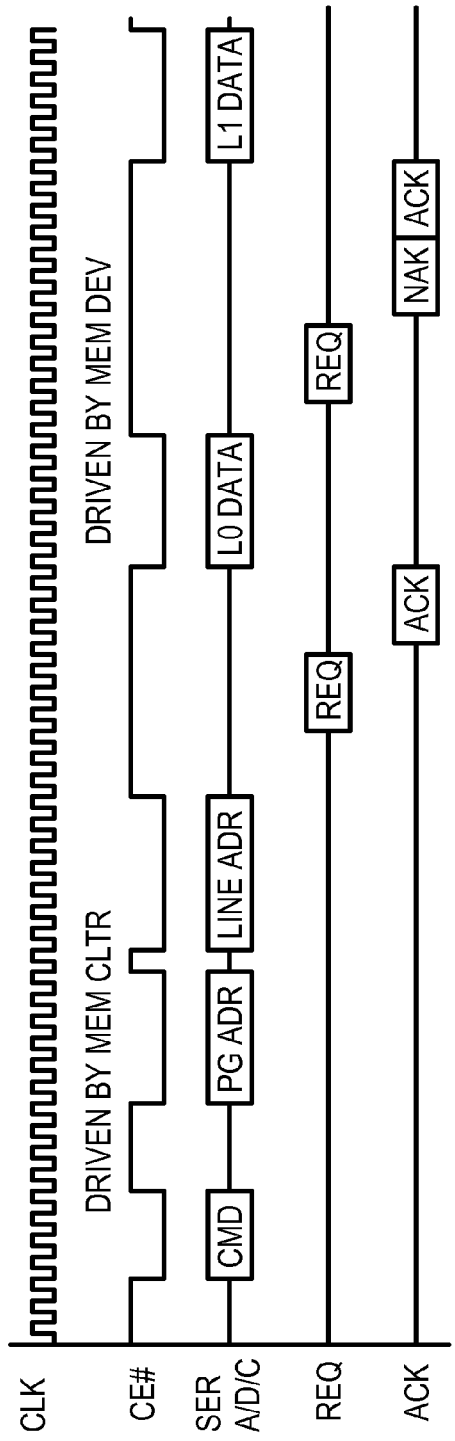

FIGS. 10A-B are timing diagrams of hits and a miss for reads of a single bank of PCM. In FIG. 10A, a read misses in the LUT when reading a single bank in the PCM chip. The memory controller or upstream PCM chip drives CE# low (active) when transferring the command, page address, and line addresses. The request REQ line is driven low by the upstream chip after the command and addresses have been sent.

The local PCM chip responds to the REQ by performing the command operation (read). Initially the upstream ACK line is driven inactive (not-ACK) by the local PCM chip. Once the data has been read from the PCM bank and is ready for transfer to the upstream chip, the ACK line is driven into the active state (ACK). The data read from the PCM bank is sent upstream when the local PCM chip drives CE# active-low shortly after the ACK is generated. Since reading from the PCM bank is slower than reading from the RAM LUT, the not-ACK signal may be generated for a relatively long period of time until switching to the ACK state. For example, not-ACK could be a low signal on the ACK line while ACK is a high signal on the ACK line.

In FIG. 10B, a read misses in the LUT when reading a single bank in the PCM chip. The memory controller or upstream PCM chip drives CE# low (active) when transferring the command, page address, and line addresses. The request REQ line is driven low by the upstream chip after the command and addresses have been sent.

The local PCM chip responds to the REQ by performing the command operation (read). The upstream ACK line is quickly driven active by the local PCM chip. The first line (L0) data is quickly read from the LUT and sent upstream when the local PCM chip drives CE# active-low shortly after the ACK is generated.

The memory controller can send another REQ signal without a new command or address to request the next line (L1) after the requested line (L0). Initially the upstream ACK line is driven inactive (not-ACK) by the local PCM chip since there may not have been enough time to read the next line from the LUT. Once the data has been read from the LUT and is ready for transfer to the upstream chip, the ACK line is driven into the active state (ACK). The line-1 (L1) data read from the LUT is sent upstream when the local PCM chip drives CE# active-low shortly after the ACK is generated.

Figure 11A:
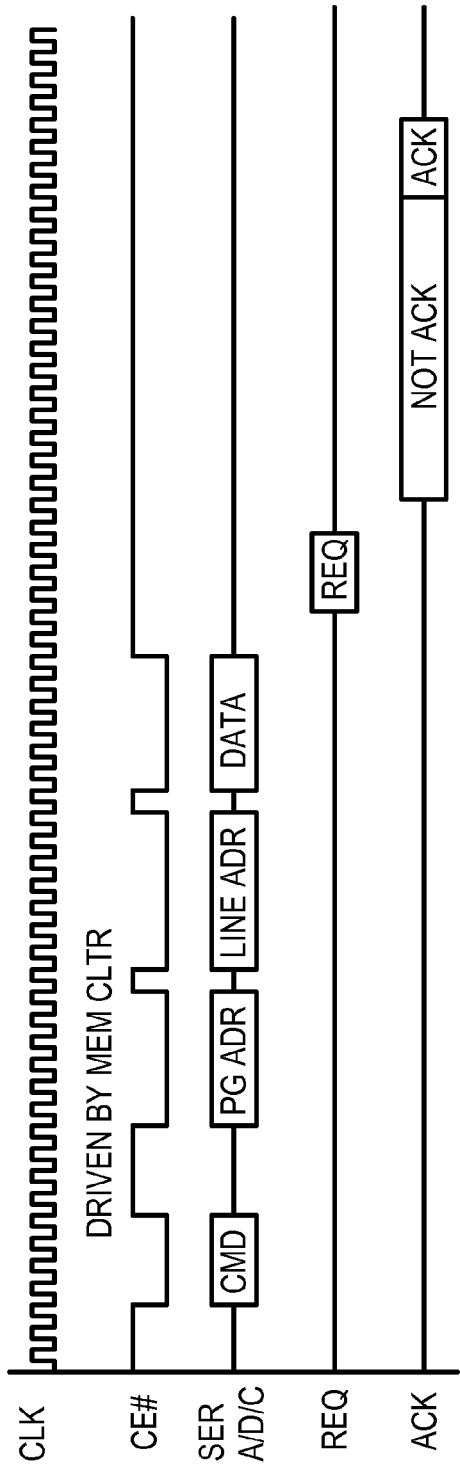
FIGS. 11A-B are timing diagrams of hits and a miss for writes to a single bank of PCM.
Figure 11B:
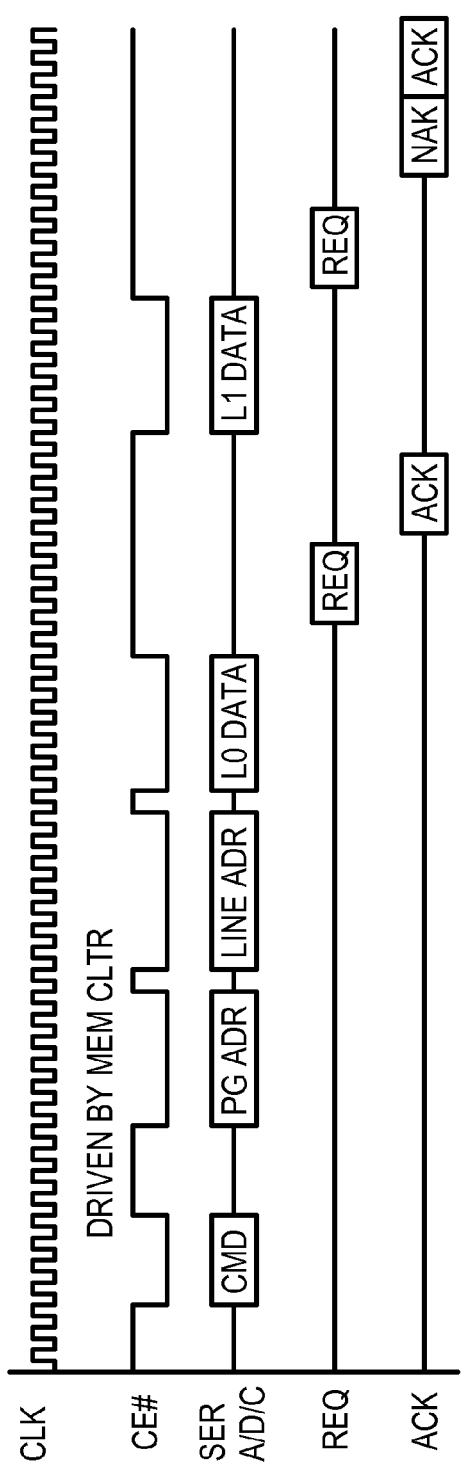

FIGS. 11A-B are timing diagrams of hits and a miss for writes to a single bank of PCM. In FIG. 11A, a write misses in the LUT when writing a single bank in the PCM chip. The memory controller or upstream PCM chip drives CE# low (active) when transferring the command, page address, line address, and data. The request REQ line is driven low by the upstream chip after the command, addresses, and data have been sent.

The local PCM chip responds to the REQ by performing the command operation (write). Initially the upstream ACK line is driven inactive (not-ACK) by the local PCM chip. Once the data has been written into the PCM bank, the ACK line is driven into the active state (ACK).

Since writing to the PCM bank is slower than writing to the RAM LUT, the not-ACK signal may be generated for a relatively long period of time until switching to the ACK state.

In FIG. 11B, a write misses in the LUT when writing a single bank in the PCM chip. The memory controller or upstream PCM chip drives CE# low (active) when transferring the command, page address, line address, and data. The request REQ line is driven low by the upstream chip after the command, addresses, and data have been sent.

The local PCM chip responds to the REQ by performing the command operation (write). The upstream ACK line is quickly driven active by the local PCM chip. The first line (L0) data is quickly written into the LUT.

The memory controller can write another line of data without a new command or address immediately after the first line (L0). The memory controller drives the second line data (L1 DATA) and pulses CE# to latch the write data into the local PCM chip. The request line REQ is driven active by the memory controller, causing the local PCM chip to write the line-1 data into the selected PCM bank.

Initially the upstream ACK line is driven inactive (not-ACK) by the local PCM chip when the second line misses in the LUT. Once the data has been written into the LUT and the selected PCM bank, the ACK line is driven into the active state (ACK).

FIGS. 12A-B are timing diagrams of hits and a miss for reads of a two banks of PCM. In FIG. 12A, a read misses in the LUT when reading a two banks in the PCM chip. The memory controller or upstream PCM chip drives CE# low (active) when transferring the command, page address, and line addresses. The request REQ line is driven low by the upstream chip after the command and addresses have been sent. However, rather than sending just one address as in FIG. 10A, two bank addresses B1, B2 and two line addresses L1, L2 are sent before REQ is activated.

The local PCM chip responds to the REQ by performing the command operation (read). Initially the upstream ACK line is driven inactive (not-ACK) by the local PCM chip. Once the data has been read from both of the PCM banks and is ready for transfer to the upstream chip, the ACK line is driven into the active state (ACK). The data read from the first bank B1 is sent upstream when the local PCM chip drives CE# active-low shortly after the ACK is generated. Then the data read from the second bank (B2) is sent upstream when the local PCM chip drives CE# active-low for a second time after the ACK was generated.

Since reading from the PCM bank is slower than reading from the RAM LUT, the not-ACK signal may be generated for a relatively long period of time until switching to the ACK state. However, two lines of data from two different PCM banks are transferred in succession.

In FIG. 12B, a read misses in the LUT when reading two banks in the PCM chip. The memory controller or upstream PCM chip drives CE# low (active) when transferring the command, page address, and line addresses. The request REQ line is driven low by the upstream chip after the command and addresses have been sent. However, rather than sending just one address as in FIG. 10A, two bank addresses B1, B2 and two line addresses L1, L2 are sent before REQ is activated.

The local PCM chip responds to the REQ by performing the command operation (read). The upstream ACK line is quickly driven active by the local PCM chip.

The data read from the first bank B1 is sent upstream when the local PCM chip drives CE# active-low shortly after the ACK is generated. Then the data read from the second bank (B2) is sent upstream when the local PCM chip drives CE# active-low for a second time after the ACK was generated.

FIGS. 13A-B are timing diagrams of hits and a miss for writes to two banks of PCM. In FIG. 13A, a write misses in the LUT when writing two banks in the PCM chip. The memory controller or upstream PCM chip drives CE# low (active) when transferring the command, page address, line address, and data for two different banks. The first bank's bank address B1, line address L1, and B1 data are transferred, then the second bank's bank address B2, line address L2, and B2 data are transferred. The request REQ line is driven low by the upstream chip after both banks' command, addresses, and data have been sent.

The local PCM chip responds to the REQ by performing the command operation (write). Initially the upstream ACK line is driven inactive (not-ACK) by the local PCM chip. Once the data has been written into both of the PCM banks, the ACK line is driven into the active state (ACK).

Since writing to the PCM banks is slower than writing to the RAM LUT, the not-ACK signal may be generated for a relatively long period of time until switching to the ACK state.

In FIG. 13B, a write misses in the LUT when writing a single bank in the PCM chip. The memory controller or upstream PCM chip drives CE# low (active) when transferring the command, page address, line address, and data for two different banks. The first bank's bank address B1, line address L1, and B1 data are transferred, then the second bank's bank address B2, line address L2, and B2 data are transferred. The request REQ line is driven low by the upstream chip after both banks' command, addresses, and data have been sent.

The local PCM chip responds to the REQ by performing the command operation (write). The upstream ACK line is quickly driven active by the local PCM chip. The first bank's data (B1) is quickly written into the LUT, followed by writing the second bank's data (B2) to the second bank's line in the LUT. Once the data has been written into the LUT for both of the PCM banks, the ACK line is driven into the active state (ACK). Since writing the LUT is faster than writing to the PCM banks, the ACK signal can be driven relatively quickly.

Figure 14:
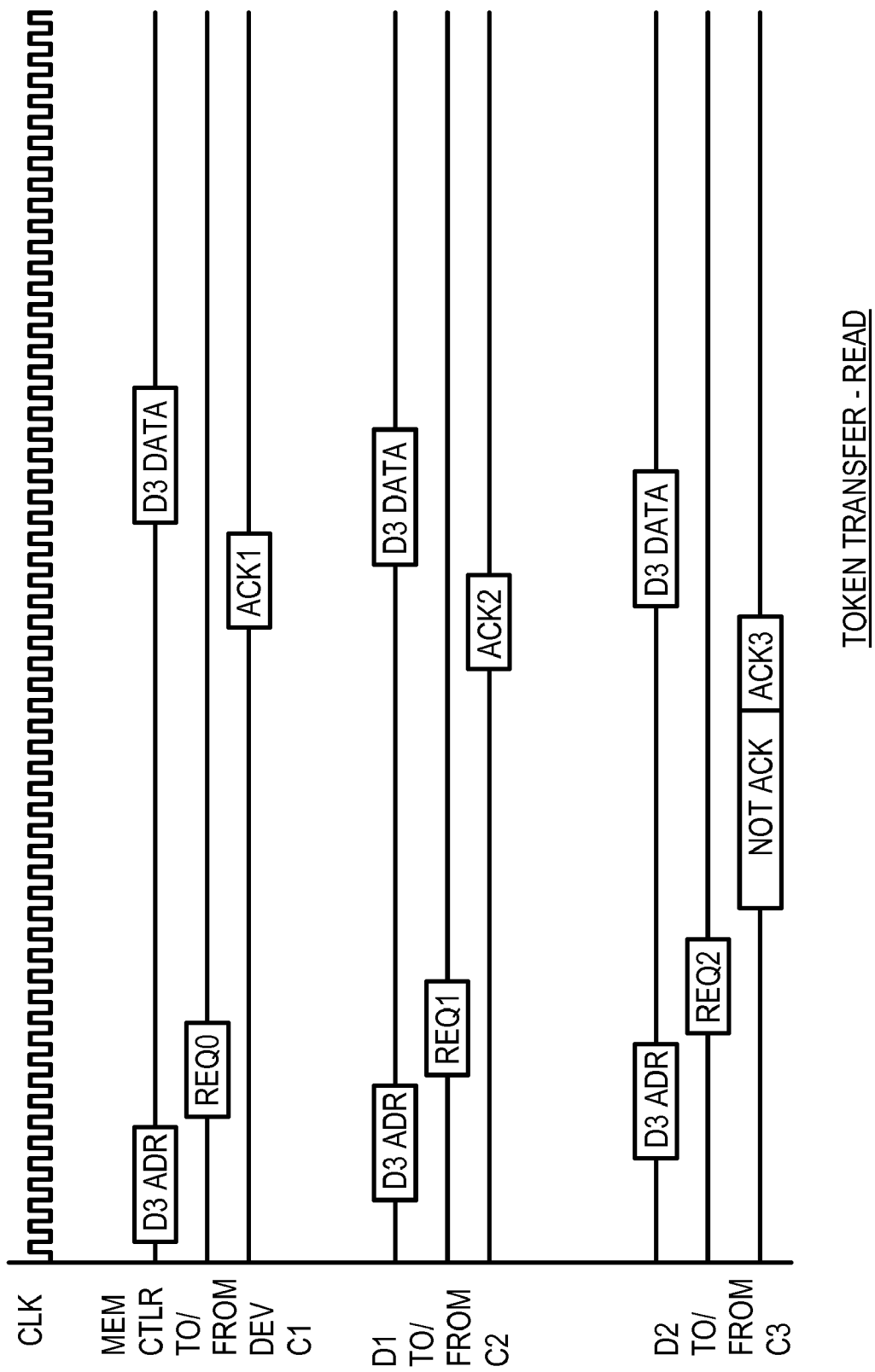
FIG. 14 is a timing diagram of token passing in a token-stub of PCM devices during a read operation.

FIG. 14 is a timing diagram of token passing in a token-stub of PCM devices during a read operation. The timing diagram is simplified and does not show address and command transfers or chip-enable signals.

The memory controller sends the address for data D3 that is stored in the third PCM chip in the token-stub. The memory controller cannot directly read the third PCM chip. Instead, the memory controller sends the D3 address and a request REQ0 to the first PCM chip C1. The first PCM chip C1 receives the request and forwards it to the second PCM chip C2, with a slight time delay, by pulsing request line REQ1 to PCM chip C2. Then the second PCM chip C2 receives the request signaled by REQ1 and forwards the address D3 to the third PCM chip C3 by pulsing its request line REQ2.

The third PCM chip C3 decodes the address D3 and determines that the address falls within its address range. The third PCM chip performs the read operation, and drives its acknowledgement line ACK3 inactive while the read operation is taking place. Once the D3 data is read, the third PCM chip C3 drives its acknowledgement line ACK3 active, and then sends the data as data D3 to the second PCM chip.

The second PCM chip receives the data and acknowledgement on ACK3 from the third PCM chip, and forwards the data to the first PCM chip by driving the ACK2 line between the second and first PCM chips. The first PCM chip receives the data and sends the D3 data to the memory controller by driving the acknowledgement line ACK1 between the first PCM chip C1 and the memory controller. Thus D3 data read from the third PCM chip is passed up the token-stub to the memory controller using several request and acknowledgement lines.

Figure 15:
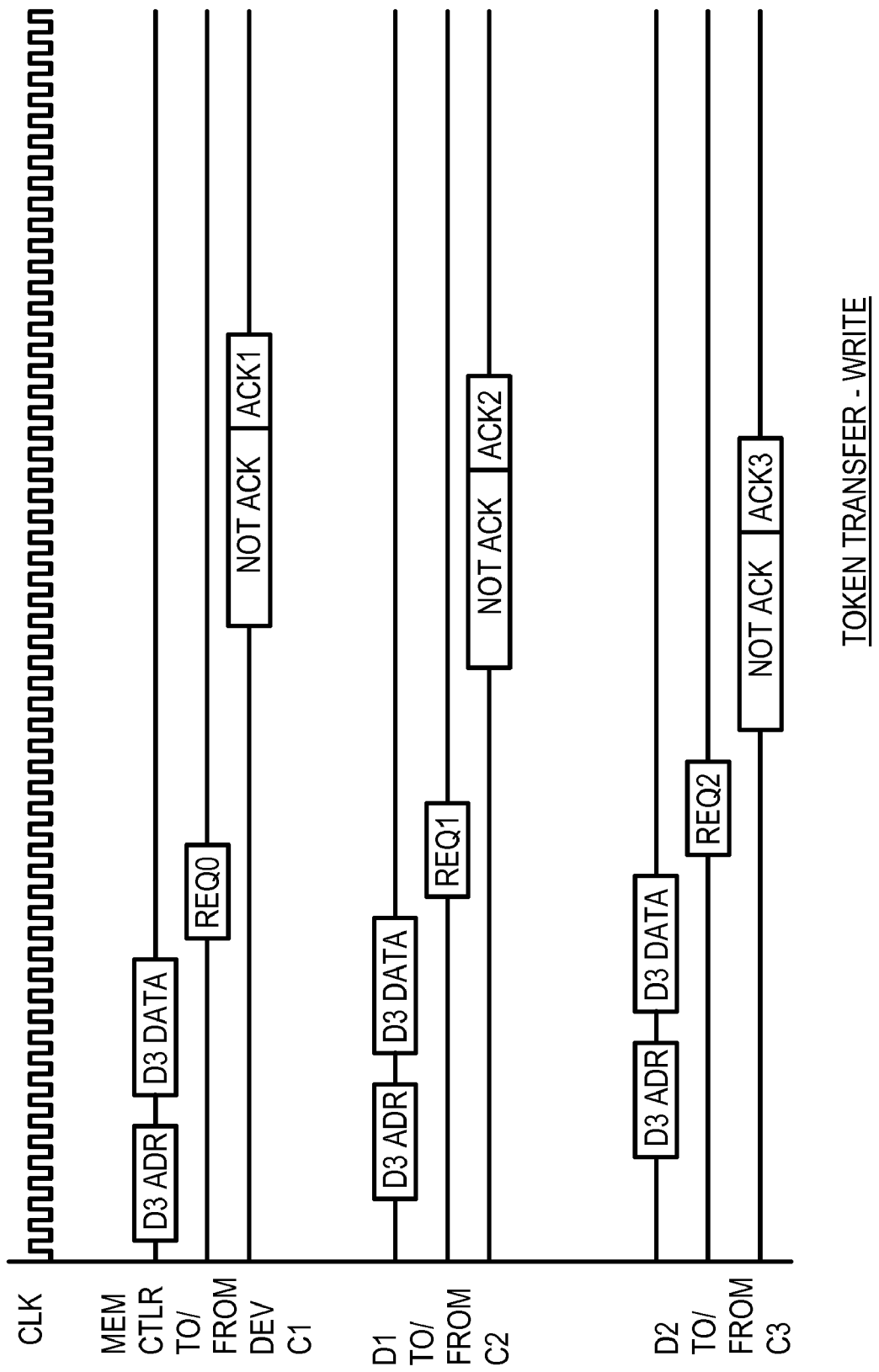
FIG. 15 is a timing diagram of token passing in a token-stub of PCM devices during a write operation.

FIG. 15 is a timing diagram of token passing in a token-stub of PCM devices during a write operation. This timing diagram is simplified and does not show address and command transfers or chip-enable signals.

The memory controller sends data and address D3 for an address to be stored in the third PCM chip in the token-stub. The memory controller cannot directly write the third PCM chip. Instead, the memory controller sends the D3 address and D3 data over request line REQ0 between the memory controller and the first PCM chip C1.

The first PCM chip C1 receives the request and forwards both the address and data to the second PCM chip C2, with a slight time delay, followed by pulsing request line REQ1 to PCM chip C2. Then the second PCM chip C2 receives the address and data of the request signaled by REQ1 and forwards address D3 and data D3 to the third PCM chip C3 by pulsing its request line REQ2.

The third PCM chip C3 decodes the address D3 and determines that the address falls within its address range. The third PCM chip performs the write operation, and drives its acknowledgement line ACK3 inactive while the write operation is taking place. Once the D3 data is written to the D3 address, the third PCM chip C3 drives its acknowledgement line ACK3 active.

The not-ACK state of line ACK3 is copied by the second PCM chip to its ACK2 line between the first and second PCM chips. Then the first PCM chip copies the state of its ACK2 line and passes the state of ACK2 to ACK1 to the memory controller. When the state of the third PCM chip's ACK3 line changes from the not-ACK state to the ACK state, this state transition is passed up the token-stub.

Figure 16:
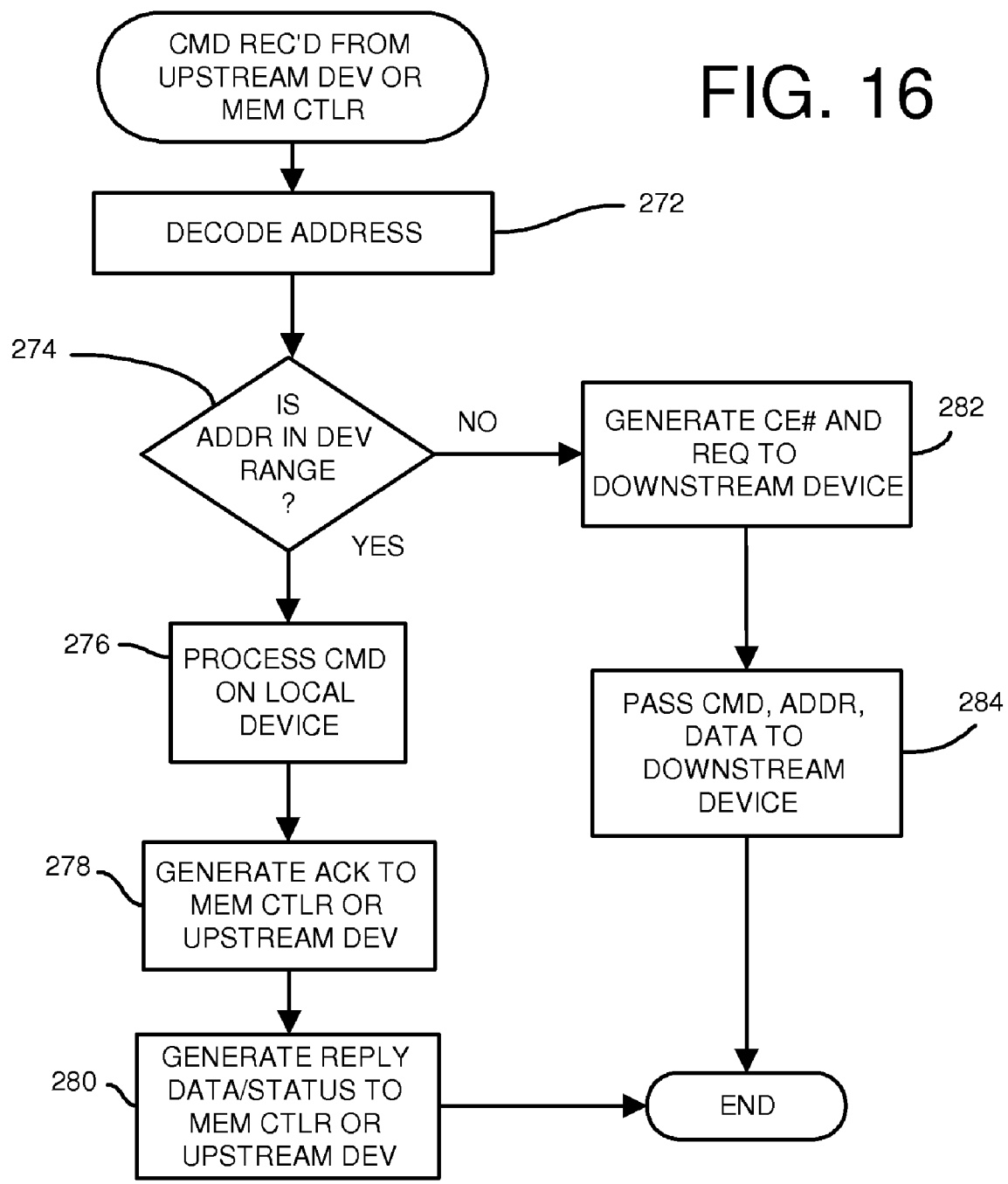
FIG. 16 is a flowchart of token-command bypassing in a PCM chip in a token-stub.

Token-Processing in Token-Stub—FIG. 16

FIG. 16 is a flowchart of token-command bypassing in a PCM chip in a token-stub. When a serialized command is received from the memory controller or the upstream PCM chip, the command's address is converted to parallel format and decoded, step 272. The decoded address is compared to a range of addresses for that PCM chip, step 274.

When the command's address is not within the address range of the local PCM chip, step 274, then the command is passed on to the next downstream PCM chip in the token-stub. The chip-enable CE# and request REQ signals are generated to the next downstream PCM chip, step 282. The command, address, and any write data are then passed on from the local PCM chip to the next downstream PCM chip, step 284.

When the command's address falls within the address range of the local PCM chip, step 274, then the command is sent to the local PCM block of the local PCM chip for local processing, step 276. The command is processed by the local PCM block, such as by reading or writing data. Once the command has been processed, or is nearing completion, the acknowledgement ACK signal is generated back to the memory controller or the upstream PCM chip, step 278. The reply data or status is sent upstream, step 280.

ALTERNATE EMBODIMENTS

Several other embodiments are contemplated by the inventors. For example different numbers and arrangements of devices, banks, and buffers may be used, such as 32 banks, 64 banks, or 8 banks. Data lines may be wider, allowing multiple banks to be loaded at once. The page and line sizes may vary, and buffers may be various depths and widths. Additional buffers and registers for pipelining may be added, while some buffers may be bypassed or removed. The serial interface may be a single differential pair, or may have several differential pairs in parallel.

The request and acknowledgement signals shown in FIG. 5 may also be combined with the clock extraction scheme of FIG. 6. A PCM chip (or local PCM block 100) can have one or more banks that can be divided into pages and lines. Each of the interleaved banks of PCM can be further sub-divided into pages and lines. A page can be a row of data in a bank, while each page contains multiple lines. For example, a page could be 256 bits (32 bytes), and each line could be 8 bytes, for pages with 4 lines per page. Other page and line sizes could be substituted, and multi-row pages or multiple pages per row could be used, or multi-bank pages, etc.

Error correction information may also be appended to the host data. A bank of PCM may include data area 24 where host data is stored, and ECC area 26 where error-correction code (ECC) generated from the host data is stored. Both the stored host data and the ECC bytes can be read from the PCM chips and latched into page register 22. The host data and ECC bytes in page register 22 may then be used to calculate error correction information, such as by generating a Reed-Solomon syndrome that specifies locations of errors and allows for error repair. More complex multi-bit errors may be uncorrectable yet still reported by the error corrector.

While ECC bytes have been described, the number of bits of ECC information does not have to be a multiple or 8 bits, but could be an arbitrary width. The LUT could be a PCM rather than a SRAM. Even though PCM writes are relatively slow, the smaller size of the LUT may improve performance.

The PCM device may support various operations such as Read (Random Byte read, Block read, page read, Buffered Page read), Program (Random Byte write, block write, page write, and buffered page write), Erase (Block erase, Page erase), Read Status, Read ID, Read PCM Type, Copy Back, and Reset command. ECC support may be provided in some embodiments but not in other embodiments. Timings may vary when data crosses into a second bank or page.

Configurable features may include block size, page size, data bus width, PCM memory chip size, number of banks, interrupt enable, ECC functionality, copy back functionality, command configuration, number of address cycles (3 address-byte cycles can address up to 8 Gbit memory, for higher capacity, like 16-Gb or above, 4 address cycles may be needed), number of ID read and status read cycles, spare area usage definition, etc.

Addresses may be latched at the local banks in the local row decoder and local column decoder. The row decoder latches the row portion of the address, either before or after decoding, while the column decoder latches the column portion of the address, either before or after decoding. A bank enable may also be latched. Alternately, addresses may be latched outside of the PCM bank array. Sequential addresses could be internally generated or altered. Various burst orders of the data bytes and addresses may be used.

While an 8-bit data byte has been described, the data word could be other widths, such as 4 bits, 12 bits, 16 bits, or multiples of 8 bits, or other values. A data mux could be a mux with logic gates or transmission gates, or could use wired-OR logic or be a bus multiplexer that uses the data lines that are physically connected to several or all banks, and are controlled to connect each data byte to just one bank at a time. Time multiplexing may also be employed.

While a PCM chip with various internal functions has been described, some functions could be performed outside of the PCM chips, such as by a PCM controller, microcontroller, glue logic, bus controller, or other chips. Address translation or pre-decoding could also be performed. The PCM array could be on several chips rather than on one chip, or could be integrated with a larger system chip having other functions such as a processor.

The PCM cells can use select transistors in series with the variable resistor as shown, or additional transistors may be added, such as for a dual-port memory with 2 bit lines per cell, and two select transistors that connect to the same alloy resistor. The melting and crystalline temperatures may vary with the alloy composition and with other factors such as impurities. The shape and size of the alloy resistor may also affect these temperatures and set, reset time periods.

The terms set and reset can be applied to either binary logic state. For example, set can refer to changing to the logic 1 state for positive logic, or to changing to the logic 0 state for negative or inverse logic. Likewise, reset is to 0 for positive logic, but inverted logic can reset to 1, such as for active-low logic. Set and reset can also refer to remaining in the previous state, such as setting a cell that is already 1. One system can use both active-high and active-low logic domains, and logic can refer to the physical states of the memory cells, or the data read at the I/O of a memory chip, or at some other point.

Directional terms such as upper, lower, up, down, top, bottom, etc. are relative and changeable as devices are rotated, flipped over, etc. These terms are useful for describing the device but are not intended to be absolutes.

The address decoders may be included as part of a memory controller, microcontroller, serial engine, DMA, PCM memory controller, transaction manager, or other controllers. Functions can be implemented in a variety of ways. Some functions can be programmed and executed by a CPU or other processor, or can be implemented in dedicated hardware, firmware, or in some combination. Many partitioning of the functions can be substituted.

A standard flash, DRAM, or SRAM controller may be integrated with the PCM controller to allow for accessing these various kinds of memories. Various routines may contain instructions that are part of the operating system, basic input-output system (BIOS), manufacturer-specific routines, and higher-level application programs, and various combinations thereof. Various modified bus architectures may be used. Buses such as the local bus may have several segments isolated by buffers or other chips.

The phase-change memory has been described as having cells that each store one binary bit of data. However, multilevel cells (MLC) are contemplated wherein multiple logic levels are defined for different values of resistance of the alloy resistor. The architecture could be extended to other kinds of devices such as NAND flash memory devices.

The background of the invention section may contain background information about the problem or environment of the invention rather than describe prior art by others. Thus inclusion of material in the background section is not an admission of prior art by the Applicant.

Any methods or processes described herein are machine-implemented or computer-implemented and are intended to be performed by machine, computer, or other device and are not intended to be performed solely by humans without such machine assistance. Tangible results generated may include reports or other machine-generated displays on display devices such as computer monitors, projection devices, audio-generating devices, and related media devices, and may include hardcopy printouts that are also machine-generated. Computer control of other machines is another tangible result.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claim elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. A serializing token-stub phase-change memory (PCM) comprising:

an upstream serial interface to a memory controller or to an upstream phase-change memory device in a token-stub of phase-change memory devices;

a downstream serial interface to a downstream phase-change memory device in the token-stub of phase-change memory devices;

a deserializer that extracts a write address and a write word in a write request from a serial bitstream received by the upstream serial interface when the write address is within an address range of the serializing token-stub phase-change memory;

wherein the deserializer further extracts a read address in a read request from the serial bitstream received by the upstream serial interface when the read address is within the address range of the serializing token-stub phase-change memory;

a serializer that generates a serial output bitstream to the upstream serial interface from a read data word in response to the read request;

a host write buffer, coupled to the deserializer, for storing a write data word;

a host read buffer, coupled to the serializer, for storing the read data word;

a plurality of PCM cells each having a first logical state having an alloy in a crystalline phase and a second logical state having the alloy in an amorphous phase, wherein a resistance of the alloy is higher when in the amorphous phase than when in the crystalline phase;

a plurality of banks, each bank comprising:
  an array of the plurality of PCM cells;
  a row decoder, receiving a row portion of the write address or receiving a row portion of the read address, for selecting a row of the plurality of PCM cells selected by an activated word line selected from a plurality of word lines in the array;
  a column decoder, receiving a column portion of the write address or receiving a column portion of the read address, for selecting a column of the plurality of PCM cells in the array as selected PCM cells;
  local sense amplifiers for reading the read data word stored in the selected PCM cells in response to the read address; and
  local write drivers activated by the write data word for driving a set pulse for a set period of time to the selected PCM cells that are being written to a first logical state, and for driving a reset pulse for a reset period of time to the selected PCM cells that are being written to a second logical state;

whereby set and reset pulses are driven to the selected PCM cells from the write data word received by the upstream serial interface.

2. The serializing token-stub phase-change memory of claim 1 further comprising:

an acknowledgement generator, coupled to the upstream serial interface, for generating an upstream acknowledgement signal in response to the read request;

a request generator, coupled to the downstream serial interface, for generating a downstream request signal in response to the read address or the write address not being within the address range;

an acknowledgement receiver, coupled to the downstream serial interface, for receiving an upstream acknowledgement signal indicating an acknowledgement bitstream to pass on to the upstream serial interface; and a request receiver, coupled to the upstream serial interface, for receiving an upstream request signal indicating transmission of the serial bitstream containing the read request or the write request.

3. The serializing token-stub phase-change memory of claim 2 further comprising:
a cache for storing copies of data lines stored in the plurality of PCM cells, the cache having lines of data and tags of addresses for the lines of data;
write data lines coupled between the host write buffer and the cache, for initially storing the write data word in the cache; and
read data lines coupled between the host read buffer and the cache, for reading the read data word from the cache when a tag portion of the read address matches a tag in the cache,
whereby set and reset pulses are driven to the selected PCM cells from the write data word initially stored in the cache, freeing the write data lines for other data transfers when the set and reset pulses are applied.

4. The serializing token-stub phase-change memory of claim 3 further comprising:
a handshake protocol controller for delaying generation of the upstream acknowledgement signal by the upstream serial interface when the read data word is not stored in the cache,
whereby non-cached data delays generation of the upstream acknowledgement signal.

5. The serializing token-stub phase-change memory of claim 3 further comprising:
an upstream shared chip-enable line, coupled between the upstream serial interface and the upstream phase-change memory device in the token-stub, wherein the upstream serial interface drives the upstream shared chip-enable line when sending an acknowledgement serial bitstream; and
a downstream shared chip-enable line, coupled between the downstream serial interface and the downstream phase-change memory device in the token-stub, wherein the downstream serial interface drives the downstream shared chip-enable line when sending the serial bitstream.

6. The serializing token-stub phase-change memory of claim 3 wherein a PCM cell in the plurality of PCM cells comprises:
a select transistor receiving a word line on a gate, and having a channel between a bit line and a cell node;
an alloy resistor formed from the alloy, coupled between the cell node and an array voltage;
wherein the PCM cell has the first logical state when the alloy resistor has the alloy in the crystalline phase, the alloy resistor having a low resistance that increases a sensing current from the bit line through the select transistor;
wherein the PCM cell has the second logical state when the alloy resistor has the alloy in the amorphous phase, the alloy resistor having a high resistance that reduces the sensing current from the bit line through the select transistor;
wherein the high resistance is larger than the low resistance;
whereby the sensing current is altered by the alloy being in the crystalline phase and the amorphous phase.

7. The serializing token-stub phase-change memory of claim 6 wherein the alloy is a chalcogenide glass layer having a melting point that is higher than a crystallization point.

8. The serializing token-stub phase-change memory of claim 7 wherein the alloy is an alloy of germanium (Ge), antimony (Sb), and tellurium (Te).

9. A memory system comprising:
phase-change memory means for storing a data word as binary bits each represented by a chalcogenide glass layer having a melting point that is higher than a crystallization point, the chalcogenide glass layer forming a variable resistor that alters a sensing current when a binary bit is read;
wherein a crystalline state of the variable resistor represents a first binary logic state and an amorphous state of the variable resistor represents a second binary logic state for binary bits stored in the phase-change memory means;
upstream serial interface means for receiving a request from a host in response to a write request from the host, and for outputting an acknowledgement to the host in response to a read request from the host;
downstream serial interface means for sending the request from the host to a downstream phase-change-memory chip when the request contains an address that is not within an address range of the phase-change memory means, and for receiving a downstream acknowledgement to the host from the downstream phase-change-memory chip, and for passing the downstream acknowledgement to the upstream serial interface means for transmission toward the host;
de-serializing means for extracting a data I/O word from a serial bitstream containing the request received by the upstream serial interface means;
serializing means for generating an acknowledgement serial bitstream to the upstream serial interface means for transmission with the acknowledgement, the acknowledgement serial bitstream being generated from a data I/O word read from the phase-change memory means in response to a read request from the host; and
I/O buffer means for storing the data I/O word received from the host by the upstream serial interface means until a data word is accumulated,
whereby requests and acknowledgements are sent over upstream and downstream serial interfaces with data I/O words stored by the phase-change memory means.

10. The memory system of claim 9 wherein the phase-change memory means further comprises:
a plurality of bank means for storing data, each bank means comprising:
an array formed of a plurality of cells of the phase-change memory means, the array having rows and columns;
row decoder means, receiving a row address, for selecting a selected row of the plurality of cells in response to the row address;
column decoder means, receiving a column address, for selecting a selected column of the plurality of cells in response to the column address;
wherein selected cells of the phase-change memory means in the array are at an intersection of the selected row and the selected column;
bank write means for storing data bits to write into the selected cells;
sense amplifier means for reading data stored in the selected cells by sensing a difference in resistance of the variable resistor when in the crystalline state and when in the amorphous state;
multi-line page buffer means, coupled to the sense amplifier means and to the bank write means, for storing a plurality of lines of data for transfer with the phase-change memory means in the bank means;

lookup table means for storing tags and for storing lines of data I/O words received from the I/O buffer means, and for supplying data I/O words to the bus I/O means in response to the read request from the host that has a tag portion of a host address that matches a tag in the lookup table means;

data line transfer means, coupled between the I/O buffer means and lookup table means, for transferring the data word stored in the I/O buffer means to the lookup table means for storage; and page transfer means, coupled between the lookup table means and the multi-line page buffer means, for transferring data lines stored in the lookup table means to the multi-line page buffer means for writing into the plurality of bank means;

whereby host write data is stored in the lookup table means before writing to the phase-change memory means in the bank means.

11. The memory system of claim 10 wherein each bank means further comprises:

set current timer means, coupled to the bank write means, for applying a set current for a set period of time to the selected cells to set variable resistors into the crystalline state when the binary bits being written are in the first binary logic state;

reset current timer means, coupled to the bank write means, for applying a reset current for a reset period of time to the selected cells to reset variable resistors into the amorphous state when the binary bits being written are in the second binary logic state;

wherein the reset current is at least twice the set current, and wherein the set current is at least twice a sensing current that passes through the variable resistor during a read operation;

wherein the set period of time is at least double the reset period of time, whereby the variable resistor is set by a lower current for a longer time period, and reset by a higher current and a shorter time period.

12. The memory system of claim 11 further comprising:

error correction means, coupled to the lookup table means, for generating error-correction code for data I/O words stored in the lookup table means, and for checking and correcting errors in data I/O words read from the phase-change memory means and stored in the lookup table means using error-correction code stored in the phase-change memory means, whereby error correction is performed for data in the lookup table means.

13. A serial token-interface phase-change memory device comprising:

an upstream serial interface that externally connects to a memory controller or to another serial token-interface phase-change memory device in a token-stub of serial token-interface phase-change memory devices that connect to the memory controller;

a downstream serial interface that externally connects to another serial token-interface phase-change memory device in the token-stub of serial token-interface phase-change memory devices;

a serial-parallel converter, coupled to the upstream serial interface, for generating a parallel bitstream from a serial bitstream received by the upstream serial interface, and for generating serial data for transmission by the upstream serial interface from a parallel read data word;

an address-data mux, coupled to the serial-parallel converter, for generating a parallel address and a parallel write data word from the parallel bitstream from the serial-parallel converter;

a plurality of banks of memory cells, each bank in the plurality of banks having an array of memory cells;

an alloy resistor in each memory cell in each array of memory cells, the alloy resistor storing binary data as solid phases each having a different resistivity;

wherein the alloy resistor changes from a crystalline state to an amorphous state when a memory cell is written from a logic 1 state to a logic 0 state in response to a reset current for a reset period of time;

wherein the alloy resistor changes from the amorphous state to the crystalline state when the memory cell is written from a logic 0 state to a logic 1 state in response to a set current for a set period of time;

wherein the amorphous state has a higher resistance than the crystalline state that is sensed by a sense amplifier;

a data input for receiving the parallel write data word from the address-data mux; and a write input buffer, coupled to the data input to receive the parallel write data word, wherein the parallel write data word converted from the serial bitstream is written to the alloy resistors in memory cells.

14. The serial token-interface phase-change memory device of claim 13 further comprising:

a lookup table for caching lines of the parallel write data words;

a tag table for storing tag portions of the parallel address for lines of the parallel write data words stored in the lookup table;

a multi-line page buffer, coupled to the plurality of banks of memory cells, for storing a page of data words for writing into the plurality of banks of memory cells or read from the plurality of banks of memory cells, wherein a page of data words comprises multiple lines of the parallel write data words or the parallel read data words; and data lines coupled between the write input buffer, the lookup table, and the multi-line page buffer, for transferring data words, whereby the parallel write data words are written into the lookup table for transfer to the multi-line page buffer for writing to the plurality of banks of memory cells.

15. The serial token-interface phase-change memory device of claim 14 further comprising:

a request input to the upstream serial interface for receiving a request signal that indicates transmission of the serial bitstream from the memory controller or to another serial token-interface phase-change memory device in the token-stub;

an acknowledgement output from the upstream serial interface for generating an acknowledgement signal to the memory controller or to another serial token-interface phase-change memory device in the token-stub after transmission of an acknowledgement serial bitstream by the upstream serial interface;

a request output from the downstream serial interface for generating a request signal to another serial token-interface phase-change memory device in the token-stub; and an acknowledgement input to the downstream serial interface for receiving an acknowledgement signal that indicates transmission of the acknowledgement serial bitstream from another serial token-interface phase-change memory device in the token-stub.

16. The serial token-interface phase-change memory device of claim 15 further comprising:
- an upstream shared chip-enable line, coupled between the upstream serial interface and the memory controller or another serial token-interface phase-change memory device in the token-stub, wherein the upstream serial interface drives the upstream shared chip-enable line when sending the acknowledgement serial bitstream; and
- a downstream shared chip-enable line, coupled between the downstream serial interface and another serial token-interface phase-change memory device in the token-stub, wherein the downstream serial interface drives the downstream shared chip-enable line when sending the serial bitstream.

17. The serial token-interface phase-change memory device of claim 16 further comprising:
- a plurality of bank write latches, coupled to the multi-line page buffer, wherein each bank in the plurality of banks has a local bank write latch that receives a bank portion of the data word from the data lines;
- a plurality of write drivers, wherein each bank in the plurality of banks has a local write driver that applies the set current for the set period of time to memory cells being written by bits in the logic 1 state in the bank portion of the data word stored in the local bank write latches, and that applies the reset current for the reset period of time to memory cells being written by bits in the logic 0 state in the bank portion of the data word stored in the local bank write latches;
- wherein the set period of time is at least 5 times longer than the reset period of time;
- wherein unequal set and reset pulses are applied to the alloy resistors to for changes between the crystalline state and the amorphous state; and
- a plurality of bank sense amplifiers, coupled to the multi-line page buffer, wherein each bank in the plurality of banks has a local bank sense amplifier that senses data stored in selected memory cells by sensing currents passing through alloy resistors having a higher resistance when in the amorphous state than when in the crystalline state;
- wherein the bank portion of the data word is written from the local bank write latches into the memory cells while the data lines are disconnected from writing the local bank write latches, the data lines able to transfer data to other banks in the plurality of banks while the data word is written from the local bank write latches into the memory cells,
- whereby concurrent writes and data transfers to different banks are performed.

18. The serial token-interface phase-change memory device of claim 13 wherein the data word stored in the memory cells is retained when power is disconnected,
- wherein the alloy resistors remain in the amorphous state and remain in the crystalline state when power is disconnected;
- whereby the data word is stored in non-volatile memory.

19. The serial token-interface phase-change memory device of claim 14 wherein the lookup table is a volatile memory, wherein lines of data words in the lookup table are lost when power is disconnected, while data words stored in the plurality of banks of memory cells are retained when power is disconnected,
- whereby the data word is stored in non-volatile memory and cached in volatile memory.

20. The serial token-interface phase-change memory device of claim 14 wherein the lookup table comprises a smaller array of the memory cells each having the alloy resistor, the alloy resistor storing binary data as solid phases each having a different resistivity,
- whereby the lookup table is non-volatile.

* * * * *